United States Patent
Yamashita et al.

(10) Patent No.: US 9,595,651 B2
(45) Date of Patent: Mar. 14, 2017

(54) ELECTRONIC COMPONENT PACKAGE AND METHOD FOR MANUFACTURING SAME

(71) Applicant: Panasonic Intellectual Property Management Co., Ltd., Osaka (JP)

(72) Inventors: Yoshihisa Yamashita, Kyoto (JP); Seiichi Nakatani, Osaka (JP); Koji Kawakita, Nara (JP); Susumu Sawada, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/422,990

(22) PCT Filed: Dec. 20, 2013

(86) PCT No.: PCT/JP2013/007503
§ 371 (c)(1),
(2) Date: Feb. 20, 2015

(87) PCT Pub. No.: WO2014/097643
PCT Pub. Date: Jun. 26, 2014

(65) Prior Publication Data
US 2015/0236233 A1    Aug. 20, 2015

(30) Foreign Application Priority Data
Dec. 21, 2012 (JP) ................................ 2012-279969

(51) Int. Cl.
*H01L 23/02*    (2006.01)
*H01L 21/00*    (2006.01)
(Continued)

(52) U.S. Cl.
CPC ............ *H01L 33/647* (2013.01); *C23C 14/34* (2013.01); *C23C 14/5846* (2013.01);
(Continued)

(58) Field of Classification Search
CPC ................ C23C 14/34; C23C 14/5846; H01L 2933/0033; H01L 33/56; H01L 33/58;
(Continued)

(56) References Cited

U.S. PATENT DOCUMENTS 3,934,073 A * 1/1976 Ardezzone .......... H01L 23/3107
174/549
4,835,067 A    5/1989 Levine
(Continued)

FOREIGN PATENT DOCUMENTS

JP    1-98237    4/1989
JP    5-121615   5/1993
(Continued)

OTHER PUBLICATIONS

English translation of the International Preliminary Report on Patentability issued Jun. 23, 2015 in International (PCT) Application No. PCT/JP2013/007505.
(Continued)

*Primary Examiner* — Teresa M Arroyo
(74) *Attorney, Agent, or Firm* — Wenderoth, Lind & Ponack, L.L.P.

(57) ABSTRACT

A method for manufacturing an electronic component package comprises: (i) preparing a metal foil having opposed principal surface "A" for placement of an electronic component and principal surface "B", and a through-hole located in an electronic component-placement region of surface "A"; (ii) placing the electronic component on the metal foil such that the electronic component is positioned in the electronic component-placement region, and an opening of the through-hole is capped with an electrode of the electronic component; (iii) forming a sealing resin layer on surface "A" such that the electronic component is covered with the sealing resin layer; and (iv) forming a metal plating layer on surface "B". A dry plating process and a wet plating process are performed to form the metal plating layer in step (iv) such that the through-hole is filled with the metal plating
(Continued)

layer, and the metal foil and the metal plating layer are integrated.

13 Claims, 12 Drawing Sheets

(51) Int. Cl.
| | |
|---|---|
| *H01L 33/64* | (2010.01) |
| *H01L 33/58* | (2010.01) |
| *H01L 33/62* | (2010.01) |
| *H01L 33/56* | (2010.01) |
| *C23C 14/34* | (2006.01) |
| *C23C 14/58* | (2006.01) |
| *H01L 21/768* | (2006.01) |

(52) U.S. Cl.
CPC .............. *H01L 33/56* (2013.01); *H01L 33/58* (2013.01); *H01L 33/62* (2013.01); *H01L 21/76873* (2013.01); *H01L 21/76879* (2013.01); *H01L 2224/0346* (2013.01); *H01L 2224/03825* (2013.01); *H01L 2224/8203* (2013.01); *H01L 2933/0033* (2013.01)

(58) Field of Classification Search
CPC . H01L 33/62; H01L 33/647; H01L 21/76873; H01L 21/76877; H01L 21/76879; H01L 2224/0346; H01L 2224/03462; H01L 2224/03825; H01L 2224/2746; H01L 2224/27825; H01L 2224/35125; H01L 2224/35825; H01L 2224/8203; H01L 23/481
USPC ............ 205/157; 257/98, 99, 676, 735, 678; 438/26, 27
See application file for complete search history.

(56) References Cited

U.S. PATENT DOCUMENTS

| | | | |
|---|---|---|---|
| 4,889,584 A * | 12/1989 | Wada ................... | H05K 3/205 156/151 |
| 4,935,312 A | 6/1990 | Nakayama et al. | |
| 5,684,330 A | 11/1997 | Lee | |
| 6,180,263 B1 * | 1/2001 | Naoi .................... | C23C 28/321 428/634 |
| 6,242,282 B1 * | 6/2001 | Fillion ................. | H01L 21/4853 257/E21.508 |
| 6,319,834 B1 * | 11/2001 | Erb ..................... | H01L 21/2885 257/E21.175 |
| 6,452,258 B1 | 9/2002 | Abys et al. | |
| 6,453,549 B1 * | 9/2002 | Bhatt .................... | H05K 3/4046 29/837 |
| 6,475,877 B1 | 11/2002 | Saia et al. | |
| 6,566,258 B1 * | 5/2003 | Dixit ................. | H01L 21/76801 257/E21.576 |
| 6,699,782 B2 | 3/2004 | Kim | |
| 7,132,020 B2 | 11/2006 | Nozawa et al. | |
| 7,202,107 B2 | 4/2007 | Fuergut et al. | |
| 7,285,446 B2 | 10/2007 | Shibata | |
| 7,416,763 B2 | 8/2008 | Kanda et al. | |
| 7,435,910 B2 | 10/2008 | Sakamoto et al. | |
| 7,855,389 B2 | 12/2010 | Ishikura et al. | |
| 7,927,922 B2 | 4/2011 | Shen et al. | |
| 8,062,537 B2 | 11/2011 | Tuominen et al. | |
| 8,114,712 B1 * | 2/2012 | McConnelee ......... | H01L 21/486 257/E21.499 |
| 8,237,259 B2 | 8/2012 | Pressel et al. | |
| 8,240,032 B2 | 8/2012 | Iihola et al. | |
| 8,699,233 B2 | 4/2014 | Palm et al. | |
| 2003/0026078 A1 | 2/2003 | Komatsubara et al. | |
| 2003/0060041 A1 | 3/2003 | Datta et al. | |
| 2005/0097735 A1 * | 5/2005 | Kanda .................... | H05K 3/388 29/829 |
| 2006/0006404 A1 * | 1/2006 | Ibbetson ............... | H01L 23/481 257/99 |
| 2006/0219428 A1 | 10/2006 | Chinda et al. | |
| 2007/0267136 A1 | 11/2007 | Tuominen et al. | |
| 2008/0261338 A1 | 10/2008 | Ilhola et al. | |
| 2008/0314867 A1 | 12/2008 | Woychik et al. | |
| 2008/0318027 A1 | 12/2008 | Woychik et al. | |
| 2008/0318055 A1 | 12/2008 | Fillion et al. | |
| 2009/0027204 A1 * | 1/2009 | Fujimaki .......... | G06K 19/07749 340/572.1 |
| 2009/0275257 A1 | 11/2009 | Sun et al. | |
| 2009/0289362 A1 | 11/2009 | Rhyner et al. | |
| 2010/0155925 A1 | 6/2010 | Kunimoto et al. | |
| 2011/0061909 A1 | 3/2011 | Palm et al. | |
| 2011/0175213 A1 | 7/2011 | Mori et al. | |
| 2012/0040840 A1 | 2/2012 | Okayama et al. | |
| 2012/0218721 A1 | 8/2012 | Nishimura | |
| 2012/0325531 A1 * | 12/2012 | Okouchi ............. | H05K 3/4602 174/257 |
| 2013/0056250 A1 | 3/2013 | Chung et al. | |
| 2013/0249080 A1 | 9/2013 | Lin et al. | |
| 2014/0210090 A1 | 7/2014 | Palm et al. | |
| 2015/0076545 A1 | 3/2015 | Nakatani et al. | |

FOREIGN PATENT DOCUMENTS

| | | |
|---|---|---|
| JP | 9-64247 | 3/1997 |
| JP | 10-223832 | 8/1998 |
| JP | 2001-250888 | 9/2001 |
| JP | 2002-170921 | 6/2002 |
| JP | 2003-239082 | 8/2003 |
| JP | 2005-19754 | 1/2005 |
| JP | 2006-165322 | 6/2006 |
| JP | 2008-503076 | 1/2008 |
| JP | 2008-522396 | 6/2008 |
| JP | 2009-253284 | 10/2009 |
| JP | 2010-80528 | 4/2010 |
| JP | 2011-134817 | 7/2011 |
| JP | 2011-523773 | 8/2011 |
| JP | 2012-109306 | 6/2012 |
| JP | 2012-134500 | 7/2012 |
| WO | 2010/018708 | 2/2010 |
| WO | 2011/062252 | 5/2011 |

OTHER PUBLICATIONS

English translation of the International Preliminary Report on Patentability issued Jun. 23, 2015 in International (PCT) Application No. PCT/JP2013/007504.
English translation of the International Preliminary Report on Patentability issued Jun. 23, 2015 in International (PCT) Application No. PCT/JP2013/007503.
English translation of the International Preliminary Report on Patentability issued Jun. 23, 2015 in International (PCT) Application No. PCT/JP2013/007502.
English translation of the International Preliminary Report on Patentability issued Jun. 23, 2015 in International (PCT) Application No. PCT/JP2013/007501.
Office Action issued Dec. 4, 2015 in U.S. Appl. No. 14/422,505.
International Search Report issued Mar. 18, 2014 in International (PCT) Application No. PCT/JP2013/007502.
International Search Report issued Mar. 18, 2014 in International (PCT) Application No. PCT/JP2013/007501.
International Search Report issued Mar. 18, 2014 in International (PCT) Application No. PCT/JP2013/007503.
International Search Report issued Mar. 18, 2014 in International (PCT) Application No. PCT/JP2013/007504.
International Search Report issued Mar. 18, 2014 in International (PCT) Application No. PCT/JP2013/007505.
Office Action issued May 26, 2016 in U.S. Appl. No. 14/422,972.
Office Action issued Feb. 22, 2016 in U.S. Appl. No. 14/422,294.
Office Action issued Feb. 25, 2016 in U.S. Appl. No. 14/422,615.

* cited by examiner

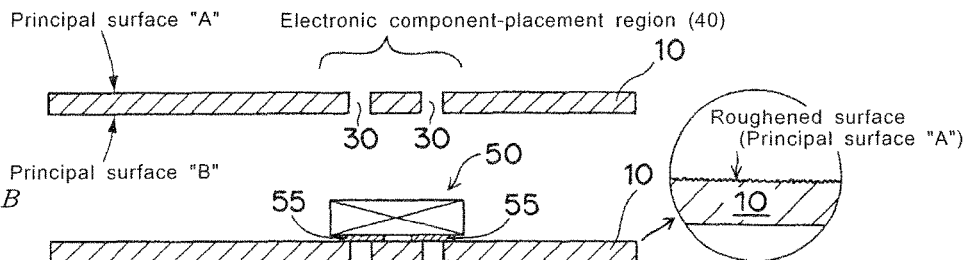
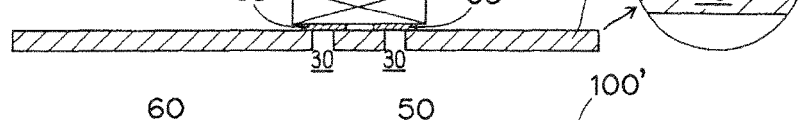
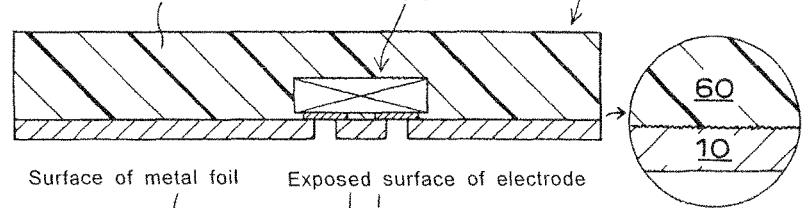
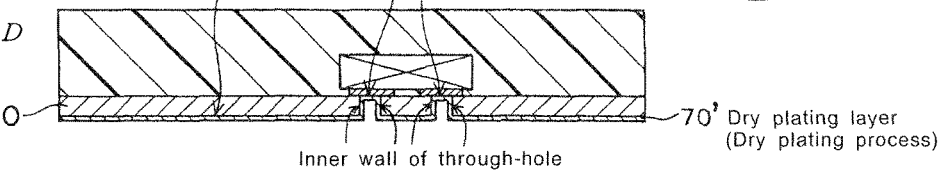
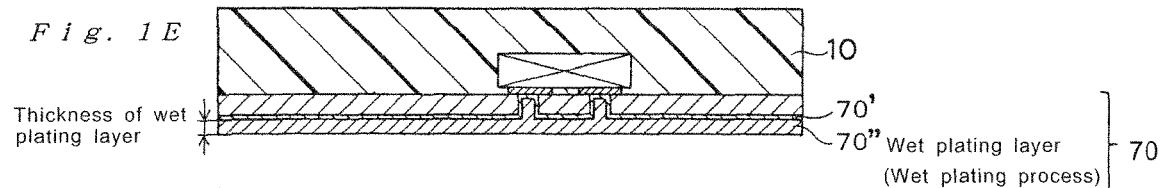
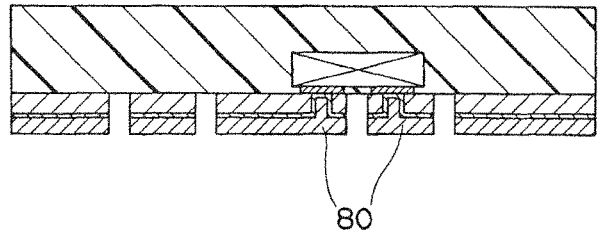

Dicing operation

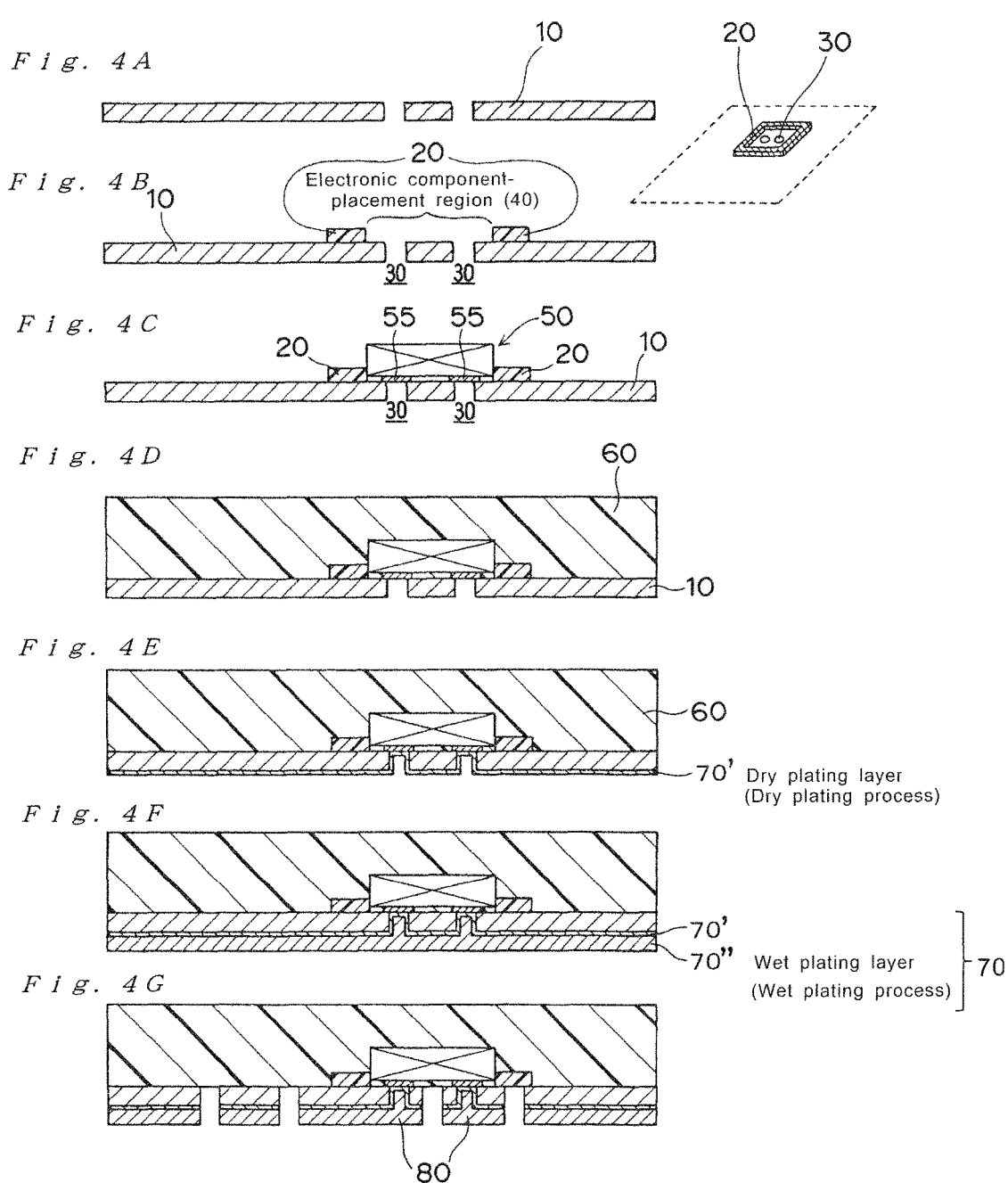

Dicing operation

Metal foil region corresponding to each of package precursor regions

Fig. 10
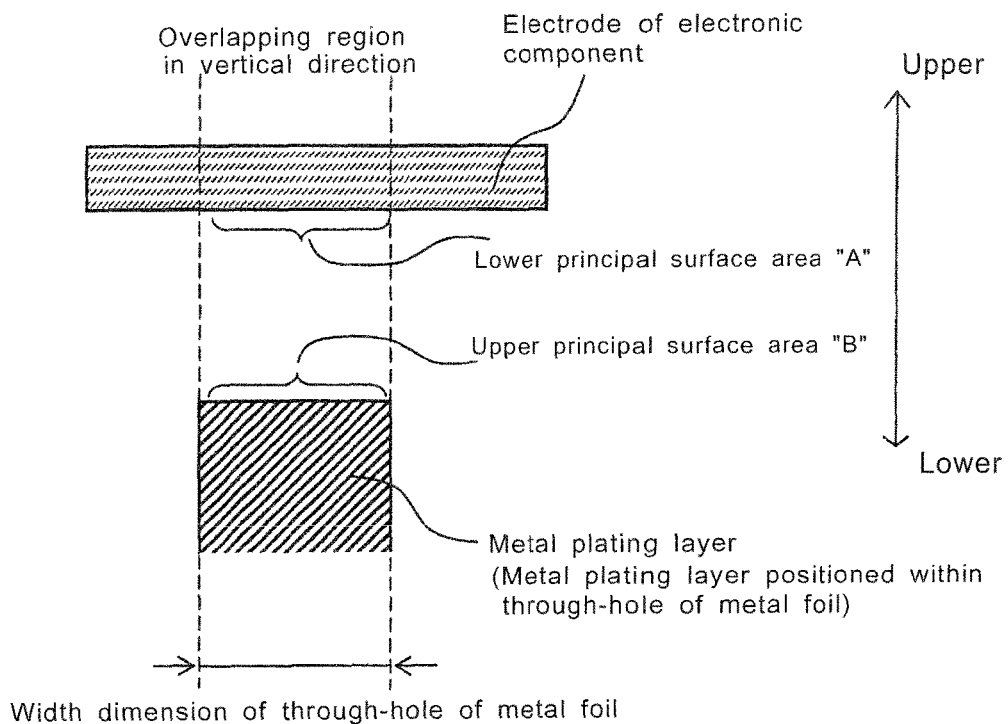
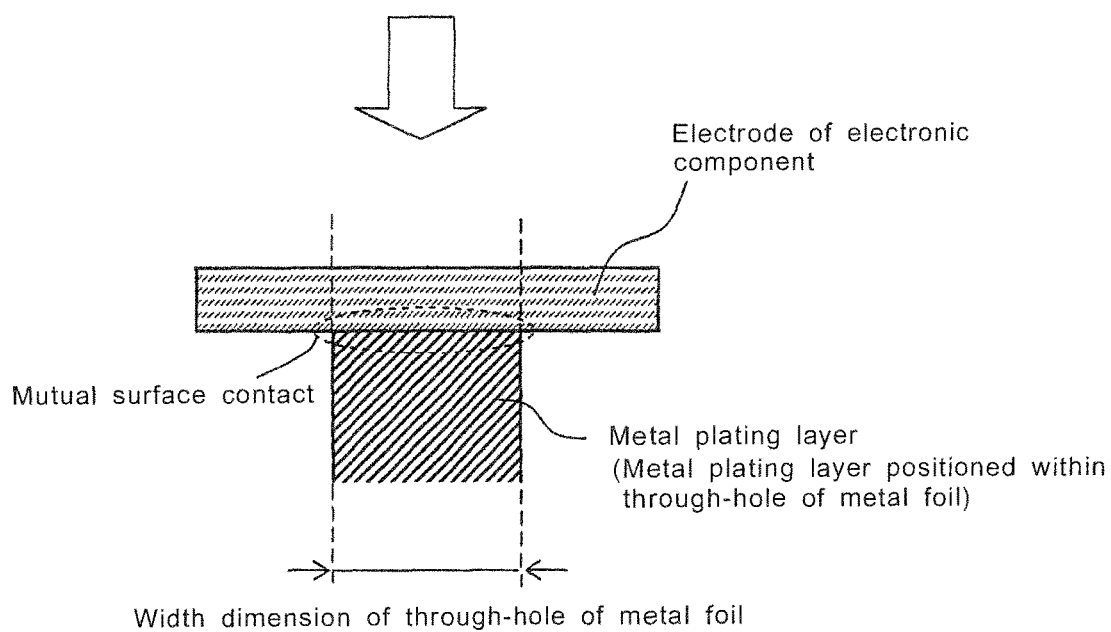

Package with circuit substrate
(Wiring-bonding type / Flip-chip type)

Package with lead frame

ELECTRONIC COMPONENT PACKAGE AND METHOD FOR MANUFACTURING SAME

CROSS REFERENCE TO RELATED PATENT APPLICATION

The present application claims priority to Japanese Patent Application No. 2012-279969, filed on Dec. 21, 2012, the entirety of which is incorporated herein by reference.

BACKGROUND OF THE INVENTION

1. Technical Field

The present disclosure relates to an electronic component package and a method for manufacturing the electronic component package. More particularly, the present disclosure relates to a package product equipped with an electronic component, and a method for manufacturing such package product.

2. Description of Related Art

With the advance of electronic devices, various package technologies have been developed in the electronics field. For example, a packaging (i.e., packaging technique) using a circuit substrate or a lead frame has been developed for a mounting of electronic components such as IC and inductor. That is, there have been used "package with circuit substrate" and "package with lead frame" as a general package form for the electronic component.

"Package with circuit substrate" (see FIG. 14A) has such a form that the electronic component has been mounted on the circuit substrate. This package is generally classified as "Wire Bonding type (W/B type)" and "Flip Chip type (F/C type)". While on the other hand, "package with lead frame" (see FIG. 14B) has such a form that a lead frame, which may be composed of a lead or die pad, is included therein. In this lead frame-type package as well as the circuit substrate-type package, a bonding of the various electronic components is provided by a soldering or the like.

PATENT DOCUMENTS

Prior Art Patent Documents

PATENT DOCUMENT 1: U.S. Pat. No. 7,927,922
PATENT DOCUMENT 2: U.S. Pat. No. 7,202,107
PATENT DOCUMENT 3: JP2008-522396

Problems to be Solved by the Invention

The technologies of the prior art cannot provide a satisfactory performance in terms of a heat releasing and a connection reliability in a high-density packaging.

SUMMARY OF THE INVENTION

Under the above circumstances, an embodiment of the present invention has been created. In other words, an object of an embodiment of the present invention is to provide an electronic component package and a manufacturing method therefor, which can achieve an improvement of the heat-releasing performance and the connection reliability in the high-density packaging.

Means for Solving the Problem

In order to achieve the above-mentioned object, an embodiment of the present invention provides a method for manufacturing an electronic component package, the method comprising the steps of:

(i) preparing a metal foil having opposed principal surfaces "A" and "B" and a through-hole, the principal surface "A" being for placement of an electronic component, the through-hole being located in an electronic component-placement region of the principal surface "A";

(ii) placing the electronic component on the metal foil such that the electronic component is positioned in the electronic component-placement region, and an opening of the through-hole is capped with an electrode of the electronic component;

(iii) forming a sealing resin layer on the principal surface "A" of the metal foil such that the electronic component is covered with the sealing resin layer; and (iv) forming a metal plating layer on the principal surface "B" of the metal foil, wherein a dry plating process is performed, and thereafter a wet plating process is also performed in the step (iv) to form the metal plating layer such that the through-hole of the metal foil is filled (or full) with the metal plating layer, and the metal foil and the metal plating layer are integrated with each other.

Furthermore, an embodiment of the present invention provides an electronic component package, comprising:

a sealing resin layer;

an electronic component buried in the sealing resin layer; and a metal wiring layer provided on the sealing resin layer and in contact with an electrode of the electronic component, wherein the metal wiring layer is composed of a metal plating layer and a metal foil, the metal plating layer being in direct contact with the electrode of the electronic component, the metal foil being integrated with the metal plating layer, wherein the metal plating layer has a two-layered structure of a dry plating layer and a wet plating layer, the dry plating layer having such a bended form that the dry plating layer is in direct contact with the electrode of the electronic component, the wet plating layer having such a form of thickness on the metal foil that a dent portion formed by the bended form of the dry plating layer is filled with the wet plating layer, and wherein a contact interface between the dry plating layer and the electrode has a smaller size than that of a surface of the electrode.

Effect of the Invention

In accordance with the electronic component package according to an embodiment of the present invention, the metal plating layer is provided so that it is in direct contact with the electronic component, which can achieve the improvement of the heat releasing performance and the connection reliability in the high-density packaging.

BRIEF DESCRIPTION OF THE DRAWINGS

FIGS. 1A to 1F are process-cross sectional views schematically illustrating a manufacturing method of an electronic component package according to an embodiment of the present invention.

FIGS. 4A to 4G are process-cross sectional views schematically illustrating a manufacturing method of an electronic component package according to an embodiment (First Embodiment) of the present invention.

FIG. 10 includes schematic views for explaining "surface contact" (i.e., "direct bonding") according to an embodiment of the present invention.

DETAILED DESCRIPTION OF THE INVENTION (Findings as Basis for Invention) The inventors have found out that the conventional packaging technologies mentioned in the paragraph "BACKGROUND OF THE INVENTION" have the following problems.

Figure 14A:
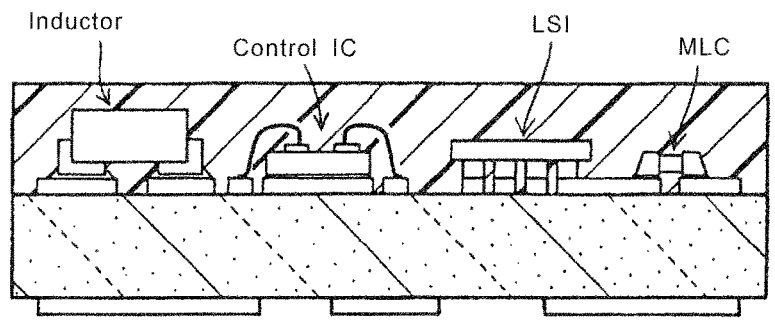
FIGS. 14A and 14B are cross-sectional views schematically illustrating configurations of an electronic component package of the prior art.

The package technology regarding "package with circuit substrate" (see FIG. 14A) makes it possible to provide a high-density packaging. However, there has been still problems of a heat releasing, the problem being attributed to the presence of the circuit substrate. The cost of the substrate in itself is not negligible, and thus "package with circuit substrate" is not necessarily satisfactory in terms of cost. Furthermore, the cost for a wire bonding or flip-chip mounting is also not negligible, and thus the cost reduction thereof is needed. In this regard, a costly mounter is generally required in the flip-chip mounting.

Figure 14B:
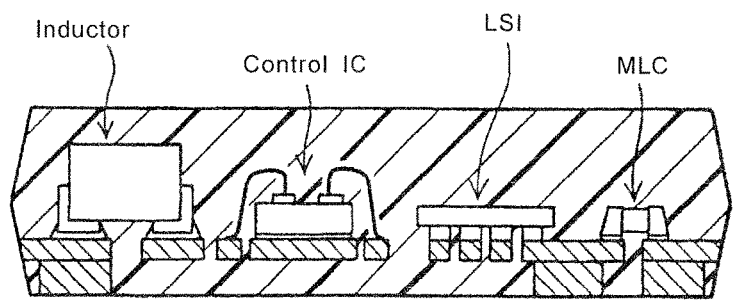

As for the lead frame-type package (see FIG. 14B), the lead frame in itself makes it difficult to provide a fine process. The lead frame-type package is thus not appropriate for the high-density packaging. The lead frame-type package as well as the circuit substrate-type package is associated with the soldering, which could raise a concern about so-called "solder flash" upon the whole sealing with resin material. Due to the solder flash, these packages are not necessarily satisfactory in terms of connection reliability. Specifically, there is such a concern that solder material used for the connection of package components can be re-melted due to the heating of the soldering for module packaging, and thus the re-melted solder material may seeps into the fine interstices (the seeping being referred to "flash"), or may adversely cause a short circuit.

Under the above circumstances, an embodiment of the present invention has been created. In other words, a main object of an embodiment of the present invention is to provide a packaging technology capable of satisfying the desired heat releasing and the connection reliability in the high-density packaging.

Rather than addressing as merely extensions of the conventional arts, the inventors tried to accomplish the above main object by addressing from a new point of view. As a result, the inventors have created the invention of an electronic component package and a manufacturing method thereof, both of which are capable of achieving the above main object. Specifically, an embodiment of the present invention provides a method for manufacturing an electronic component package, the method comprising the steps of:

(i) preparing a metal foil having opposed principal surfaces "A" and "B" and a through-hole, the principal surface "A" being for placement of an electronic component, the through-hole being located in an electronic component-placement region of the principal surface "A";

(ii) placing the electronic component on the metal foil such that the electronic component is positioned in the electronic component-placement region, and an opening of the through-hole is capped with the electrode;

(iii) forming a sealing resin layer on the principal surface "A" of the metal foil such that the electronic component is covered with the sealing resin layer; and (iv) forming a metal plating layer on the principal surface "B" of the metal foil, wherein, in the step (iv), a dry plating process, and thereafter a wet plating process are performed to form the metal plating layer such that the through-hole of the metal foil is filled (or full) with the metal plating layer, and the metal foil and the metal plating layer are integrated with each other.

One of the features of the manufacturing method of the electronic component package according to an embodiment of the present invention is that the metal foil having the through-hole in the electronic component-placement region thereof, and that the sequential dry and wet plating processes are performed so that the through-hole of the metal foil becomes filled with the metal plating layer, and the metal foil and the metal plating layer becomes integrated with each other.

Furthermore, an embodiment of the present invention also provides an electronic component package, comprising:

a sealing resin layer;

an electronic component buried in the sealing resin layer; and a metal wiring layer provided on the sealing resin layer and in contact with an electrode of the electronic component, wherein the metal wiring layer is composed of a metal plating layer and a metal foil, the metal plating layer being in direct contact with the electrode of the electronic component, the metal foil being integrated with the metal plating layer, wherein the metal plating layer has a two-layered structure of a dry plating layer and a wet plating layer, the dry plating layer having such a bended form that the dry plating layer is in direct contact with the electrode of the electronic component, the wet plating layer having such a form of thickness on the metal foil that a dent portion formed by the bended form of the dry plating layer is filled with the wet plating layer, and wherein a contact interface between the dry plating layer and the electrode has a smaller size than that of a surface of the electrode.

One of the features of the electronic component package according to an embodiment of the present invention is that the metal wiring layer is composed of "metal plating layer in direct contact with the electrode of the electronic component and a metal foil" and "metal foil integrated with the metal plating layer", and that the metal plating layer has the dry and wet plating layers, the dry plating layer having such a bended form that the dry plating layer is in direct contact with the electrode of the electronic component, the wet plating layer having such a form of thickness on the metal foil that a dent portion formed by the bended form of the dry plating layer is filled with the wet plating layer, and that a contact interface between the dry plating layer and the electrode has a smaller size than that of a surface of the electrode.

In accordance with an embodiment of the present invention, the desired heat releasing and connection reliability can be satisfied while achieving the low-cost mounting.

With respect to the "heat-releasing performance" according to an embodiment of the present invention, a mounting with no wire bonding or no bump is provided (that is, there can be provided a wire bonding-less/bump-less package), which enables the heat from the electronic component to be effectively released via the metal wiring layer. In particular, the metal wiring layer according to an embodiment of the present invention can be provided as a thicker layer due to the presence of the metal foil, which can improve the heat-releasing performance. In other words, the metal foil and the metal plating layer (dry plating layer and the wet plating layer), of which the metal wiring layer is composed, can be made of a material with high thermal conductivity (e.g., copper material), and also can be provided as "metal plating layer having the large thickness". Therefore, an embodiment of the present invention makes it possible to effectively release the heat via the metal wiring layer to the outside thereof.

An embodiment of the present invention can also achieve a packaging with no need of "soldering". As a result, the packaging with no soldering material included therein can be achieved. This makes it possible to avoid the unfavorable "solder flash", which leads to an improvement of the connection reliability.

Furthermore, the package according to an embodiment of the present invention has a "substrate-less structure". The substrate-less structure, i.e., no substrate of the package can contribute to a low-cost manufacturing of the package due to no cost of the substrate. As for such "substrate-less structure", it makes possible to achieve a more simplified packaging process, compared to the wire bonding or flip-chip mounting process. This can also contribute to the low cost manufacturing. Moreover, the use of the metal foil with its large thickness makes it possible to form the metal wiring layer with its large thickness for a shorter period of time, which can also contribute to the low cost manufacturing.

An electronic component package and a manufacturing method thereof according to an embodiment of the present invention will be hereinafter described in more detail. It should be noted that various parts or elements are schematically shown in the drawings wherein their dimensional proportions and their appearances are not necessarily real ones, and are merely illustrated for the purpose of making it easy to understand the present invention.

[Manufacturing Method of the Present Invention]

A method for manufacturing an electronic component package according to an embodiment of the present invention will be described. FIGS. 1A-1F and FIGS. 2A-2C schematically illustrate processes associated with the manufacturing method according to an embodiment of the present invention. In the manufacturing method according to an embodiment of the present invention, the step (i) is firstly carried out to prepare a metal foil 10 having opposed principal surfaces "A" and "B" and a through-hole 30, the principal surface "A" being for placement of an electronic component, the through-hole 30 being located in an electronic component-placement region 40 of the principal surface "A" of the metal foil 10.

As shown in FIG. 1A, the principal surface "A" of the metal foil 10 is provided with the electronic component-placement region 40. At least one through-hole 30 is provided in such electronic component-placement region 40. The term "electronic component-placement region" as used herein means a metal foil's surface region in which an electronic component is to be placed at a later step (ii). In other words, the electronic component-placement region is a metal foil region with which the placed electronic component in the step (ii) is overlapped.

The material of the metal foil 10 may comprise at least one kind of metal material selected from the group consisting of Cu (copper), Al (aluminum), Ag (silver), Pd (palladium), Pt (platinum), Ni (nickel), Ti (titanium), Fe (iron), Zn (zinc), Zr (zirconium), Nb (niobium), Mo (molybdenum), Sn (tin), Ta (tantalum) and Au (gold). In view of an easy-to-machine process (e.g., readily-performed formation of through-hole), the metal foil is preferably made of Cu (copper) or Al (aluminum). The thickness of the metal foil 10 is preferably in the range of 9 μm to 2000 μm, more preferably in the range of 18 μm to 1000 μm, still more preferably in the range of 200 μm to 500 μm (for example, about 300 μm). The metal foil 10 preferably has a roughened surface. Specifically, it is preferred that the principal surface "A" of the metal foil 10, which is provided with the electronic component-placement region 40, has the roughened surface (see right-sided illustration in FIG. 1B). In this case, a formation process of a sealing resin layer 60 (which will be performed at a later step) enables the sealing resin layer 60 to make contact with the roughened surface of the metal foil 10 (see right-sided illustration in FIG. 10). The presence of "roughened surface" of the metal pattern layer can increase a bonding between the metal foil and the sealing resin layer, due to the fact that the roughened surface is in a dig state into the sealing resin layer. As such, the roughened surface of the metal foil makes it possible to achieve a more improved reliability of the adhesive carrier 20.

Figure 3:
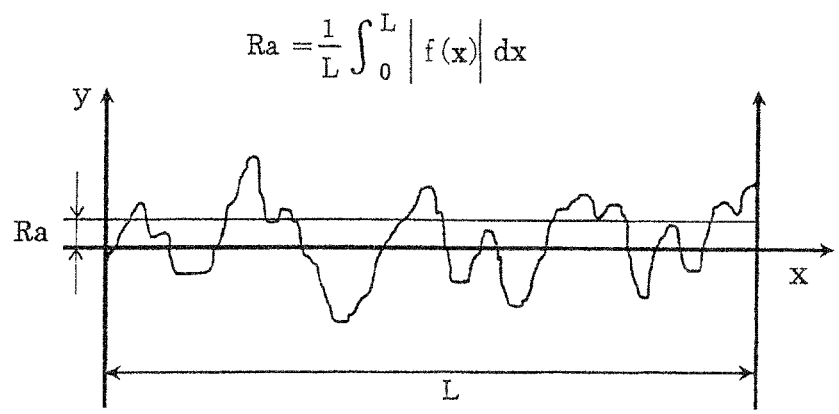
FIG. 3 is a representation of an arithmetic mean roughness "Ra".
Figure 5A:
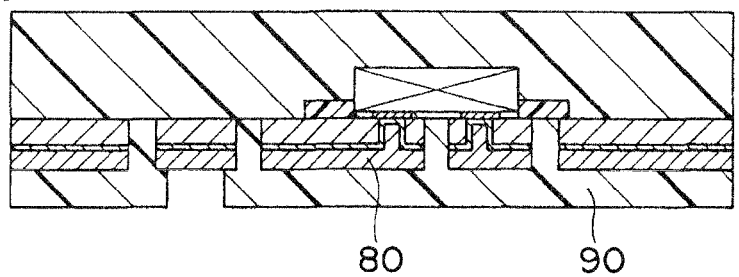
FIGS. 5A to 5C are process-cross sectional views schematically illustrating a manufacturing method of an electronic component package according to an embodiment (First Embodiment) of the present invention.
Figure 5B:
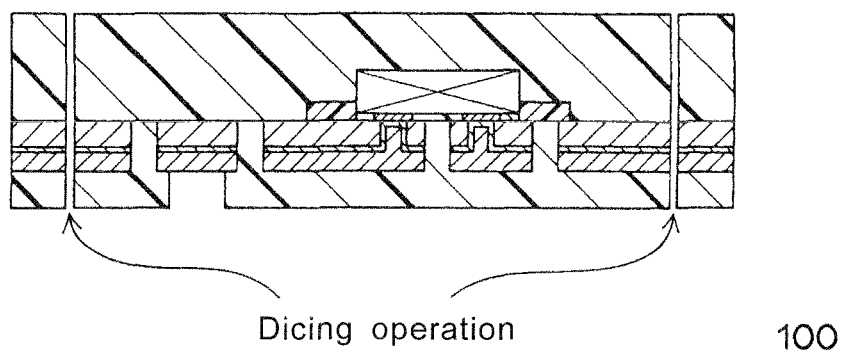
Figure 5C:
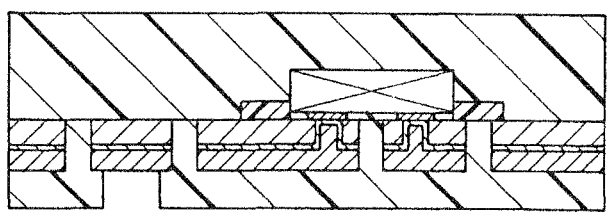

The term "roughened surface" as used herein means that the principal surface "A" of the metal foil has a rough surface (i.e., fine concave-convex surface). For example, the term "roughened surface" substantially means that an arithmetic mean roughness Rz of the surface of the metal foil 10 is 5.0 μm or higher, preferably 7.0 μm or higher. The upper limit for the arithmetic mean roughness Rz is not particularly limited, but may be about 10.0 μm or lower. In this regard, the term "arithmetic mean roughness" Rz" for the surface of the metal foil substantially is roughness "Rz" defined in JIS B0601. More specifically, the term "arithmetic mean roughness Rz" as used herein means the sum value (μm) of the average of absolute values from the uppermost mountain peak (Yp) to the fifth mountain peak (Yp) and the average of absolute values from the lowermost valley portion (Yv) to the fifth valley portion (Yv), the mountain peak and the valley portion being measured perpendicularly from the average line over the length of an evaluation section that is set in the roughness curve as shown in FIG. 3 (i.e., in a cross-sectional profile of metal foil at the principal surface "A"). See JIS B0601:1994.

For the formation of the through-hole 30 in the metal foil, a photolithography process is available. In this regard, the through-hole 30 can be provided in the metal foil 10 by an etching process. Alternatively, the through-hole 30 can be provided by a laser irradiation. Alternatively, the through-hole 30 can be provided by a machining process such as a punching process (punch cutting process). As for the shape of the through-hole 30, the planar shape of the through-hole when viewed from above may be circular. The planar shape of the through-hole is not limited to "circular", but may be other shapes such as elliptical, oval and rectangular shapes.

It is preferred that an opening size of the through-hole 30 is smaller than an electrode size of the electronic component. The reason for this is that, at a later step, the electronic component is placed on the metal foil such that the opening of the through-hole 30 of the metal foil 10 is capped with the electrode of the electronic component. In other words, it is preferred that the planar opening size of the through-hole 30 at the surface of the metal foil (i.e., the size of the planar shape of the through-hole when the metal foil is viewed from above) is smaller than the surface size of the electrode of the electronic component (i.e., the size of the planar shape of the electrode when the electronic component is viewed from above). For example, the planar opening size of the through-hole 30 is preferably in the approximate range of 40% to 95%, more preferably in the approximate range of 60% to 90% with respect to the surface size of the electrode of the electronic component.

Subsequent to the step (i), the step (ii) is carried out. Namely, as shown in FIG. 1B, at least one kind of electronic component 50 is placed on the metal foil 10. Specifically, the electronic component 50 is positioned in the electronic component-placement region, and the opening of the through-hole 30 of the metal foil 10 (especially, opening of through-hole at principal surface "A") is capped with the electrode 55 of the electronic component 50.

In the step (ii), the electronic component 50 is placed on the metal foil 10 such that the opening plane of the through-hole 30 is overlapped with the electrode surface of the electronic component 50. The phrase " . . . is capped with the electrode . . . " as used herein means that the opening of the through-hole 30 is closed. More specifically, such phrase means that the opening of the through-hole 30 (especially, the opening of the through-hole at the principal surface "A" of the metal foil) is closed with the electrode 55 of the electronic component such that, when viewed from the side of the principal surface "B", the opposite side thereto is not able to be seen due to the closed opening.

The electronic component 50 may be any suitable one as long as it is a circuit component/element used in the electronics packaging field, and also it has an electrode with its size being larger than that of the opening plane of the through-hole 30. Examples of the electronic component may include an IC (e.g., control IC), an inductor, a semiconductor element (e.g., MOS: metal-oxide semiconductor), a capacitor, a power element, a light-emitting element (e.g., LED), a chip resistor, a chip capacitor, a chip varistor, a chip thermistor and a chip laminate filter, a connection terminal and the like.

Subsequent to the step (ii), the step (iii) is carried out. Namely, as shown in FIG. 1C, a sealing resin layer 60 is formed on the principal surface "A" of the metal foil 10 such that the electronic component 50 is covered with the sealing resin layer 60, and thereby providing a precursor 100' of the electronic component package.

The formation of the sealing resin layer 60 can be performed by applying a resin material onto the electronic component-placement region of the metal foil 10 by a spin-coating process or a doctor-blade process, followed by a heat treatment or light-exposure treatment of the resin material. In other words, the sealing resin layer 60 can be provided by subjecting the applied resin material to a heat or light curing treatment. Alternatively, the sealing resin layer 60 may be provided by putting a resin film on the electronic component-placement region of the metal foil 10. Alternatively, the sealing resin layer 60 may be provided by filling an uncured powdered or liquid resin into a die, followed by a heat curing thereof.

The material for the sealing resin layer 60 may be any suitable one as long as it exhibits an electrical insulation properties. For example, the material of the sealing resin layer may be an epoxy-based resin or a silicone-based resin. The thickness of the sealing resin layer 60 is preferably in the approximate range of 0.5 mm to 5.0 mm, and more preferably in the approximate range of 1.2 mm to 1.8 mm.

Subsequent to the step (iii), the step (iv) is carried out. Namely, as shown in FIGS. 1D and 1E, a metal plating layer 70 is formed on the principal surface "B" of the metal foil 10. Specifically, the metal plating layer 70 is formed such that the metal plating layer 70 is in contact with "surface of metal foil", "inner wall surface of through-hole" and "exposed surface of electrode of the electronic component, the exposed surface serving to cap the through-hole at one end of the hole".

As for the formation of the metal plating layer 70, a dry plating process is performed with respect to the side of the principal surface "B" of the metal foil 10 (see FIG. 1D), and thereafter a wet plating process is performed (see FIG. 1E). As a result, the through-hole 30 of the metal foil 10 is filled with the metal plating layer 70, and thereby the metal foil 10 and the metal plating layer 70 are integrated with each other.

In other words, the dry plating is performed to form a dry plating layer 70' configured to be in direct contact with the electrode of the electronic component via the through-hole, and thereafter the wet plating is performed to form a wet plating layer 70" configured to be in direct contact with the dry plating layer, which causes the metal plating layer 70 and the metal foil 10 to be integrated with each other (see FIGS. 1D and 1E).

As shown in FIG. 1D, it is preferred that the dry plating layer 70' has such a bended form that it extends along an outline of the through-hole 30. In other words, it is preferred that the dry plating process is performed to form a very thin layer as the dry plating layer 70' extending along an outline of the precursor 100' of the electronic component package. While on the other hand, as shown in FIG. 1E, it is preferable to form the wet plating layer 70" having a form of thickness on the metal foil 10 with the through-hole 30 being completely filled with the layer 70". In other words, it is preferred that the wet plating process is performed to form a relatively thick layer such that the through-hole 30 of the metal foil 10 is filled with the thick layer.

The manufacturing method of the present invention according to an embodiment of the present invention has such a process feature that the metal layer is directly provided with respect to the metal foil and the exposed surface of the electrode of the electronic component. In particular, the use of the metal foil with its large thickness enables the thick metal layer to be provided for a short period of time since the thickness of the metal plating layer is substantially enough to fill the through-hole. The integration of the metal plating layer and the metal foil can be suitably used as a heat-releasing part, the metal plating layer being in contact with the electrode of the electronic component, the metal foil being integrated with the metal plating layer. When focusing on the manufacturing processes, due to the dry plating process, the subsequent wet plating process can provide the plating layer serving to fill the through-hole with no void in the interior of the through-hole, and also having good adhesion.

Examples of the dry plating process include a vacuum plating process (Physical Vapor Deposition, i.e., PVD process) and a chemical vapor plating process (Chemical Vapor Deposition, i.e., CVD process). Examples of the vacuum plating process include a sputtering process, a vacuum deposition process, and an ion plating process. On the other hand, examples of the wet plating process include an electroplating process (e.g., electrolytic plating process), a chemical plating process, and a hot-dip plating process. In a preferred embodiment of the manufacturing method of the present invention, the sputtering may be performed as the dry plating process, whereas the electroplating (e.g., electrolytic plating) may be performed as the wet plating process.

The metal plating layer 70 has a two-layered structure of the dry plating layer 70' formed by the dry plating layer (see FIG. 1D) and the wet plating layer 70" formed by the wet plating layer (see FIG. 1E). As the formation of the metal plating layer 70 proceeds along "surface of metal foil 10", "inner wall surface of through-hole 30" and "exposed surface of the electrode 55 of the electronic component", the thickness of the metal plating layer 70 is gradually increased. In this regard, the thickness of the metal plating layer 70, which serves to at least fill the interior of the through-hole 30, is enough. As such, the thickness of the metal plating layer 70 at the exterior of the through-hole 30 is preferably smaller than the thickness of the metal foil 10. This makes it possible to form the thick integration of the metal foil and the metal plating layer in contact with the electrode of the electronic component for a short period of time from the thick metal foil used as a staring material. It is preferred that the dry plating layer 70' with its thickness of 100 nm to 1000 nm is formed by the dry plating process, whereas the wet plating layer 70" with its thickness (thickness of layer area other than the through-hole area, see FIG. 1E) of 1 μm to 10 μm is formed by the wet plating process. Namely, the dry plating layer 70' is provided in the very thin form, whereas the wet plating layer 70" is provided in the thick form. The large thickness of the wet plating layer 70" enables the interior of the through-hole 30 to be filled with no void included therein.

The dry plating layer 70' formed by the dry plating process preferably comprises at least one kind of metal material selected from the group consisting of Ti (titanium), Cr (chromium), Ni (nickel), and Cu (copper). While on the other hand, the wet plating layer 70" formed by the wet plating process preferably comprises at least one kind of metal material selected from the group consisting of Cu (copper), Ni (nickel) and Al (aluminum). It is preferred that the metal foil 10, the dry plating layer 70' and the wet plating layer 70" comprise the same kind of metal material as each other. Such same metal material between the metal foil 10, the dry plating layer 70' and the wet plating layer 70" can provide the package with a satisfactory connection reliability. By way of example, all of the metal foil 10, the dry plating layer 70' and the wet plating layer 70" may comprise a copper component, at least. In this regard, the metal foil 10 may be a copper foil, the dry plating layer 70' may be a Cu thin film layer, and the wet plating layer 70" may be a copper layer.

By way of example, the dry plating layer 70' is not limited to a single layer but may be formed as a form of multiple layers. For example, a Ti thin film layer and a Cu thin film layer may be formed as the dry plating layer 70' by the sputtering process. More specifically, the formation of the Ti thin film layer is performed, followed by the formation of the Cu thin film layer, the both formations being performed by the sputtering process. On such sputtering layers having the two-layers structure, it is preferable to form a plating copper layer as the wet plating layer 70" by the electrolytic plating process.

The metal foil 10, and the metal plating layer 70 integrated therewith formed by the dry and wet drying plating processes are preferably subjected to a patterning process. Specifically, as shown in FIG. 1F, it is preferred that the patterning process of the integrated metal foil and metal plating layer is performed to form a metal wiring layer 80. The patterning treatment leads to a desired wiring formation, e.g., a desired pattern formation of wirings including an extraction electrode. The patterning in itself is not particularly limited as long as it is used in the electronics packaging field. For example, a photolithography process can be available for the patterning process, in which case a formation of resist layer, an exposure to the light and subsequent development, and an etching are sequentially performed.

In addition to the formation of the metal wiring layer in contact with the exposed surface of the electrode of the electronic component, a further metal wiring layer may be formed, the further layer being in no contact with the exposed surface of the electrode of the electronic component. Such further metal wiring layer enables the heat to be directly released therethrough, in addition to or instead of through the surfaces of the sealing resin and the electrode of the electronic component.

Figure 2A:
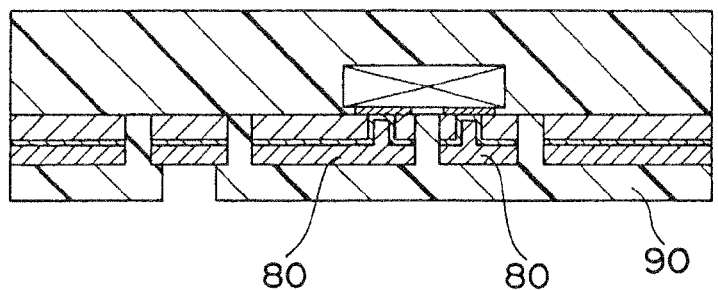
FIGS. 2A to 2C are process-cross sectional views schematically illustrating a manufacturing method of an electronic component package according to an embodiment of the present invention.

Subsequent to the patterning of the metal foil and the metal plating layer, a resist layer is preferably formed with respect to the patterned layer, i.e., the metal wiring layer. For example, it is preferred as shown in FIG. 2A that a solder resist layer 90 is formed on the surface of the sealing resin layer such that the metal wiring layer 80 is partially covered with the resist layer. The formation of the resist layer 90 may be the same as that generally used in the electronics packaging field.

Figure 2B:
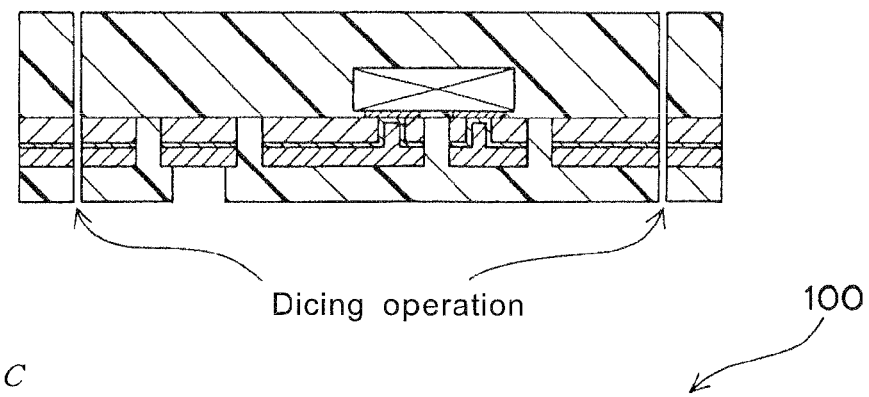
Figure 2C:
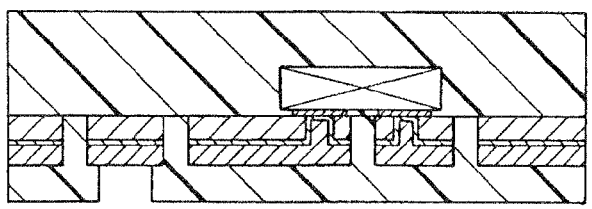

Through the above steps (with an additional step of the dicing operation as shown in FIG. 2B, for example), there can be finally obtained an electronic component package 100 as shown in FIG. 2C.

The manufacturing method of the present invention can be performed in various process embodiments, which will be now described below.

(First Embodiment)

The process of the manufacturing method according to the first embodiment of the present invention is shown in FIGS. 4A-4G and FIGS. 5A-5C.

The first embodiment has such a feature that the metal foil provided with a positioning means for the electronic component is used in the step (i). Specifically, as shown in FIGS. 4A and 4B, a supporting bank part 20 is used as the metal foil's positioning means for the electronic component, the supporting bank part 20 being provided on the metal foil such that the supporting bank part surrounds the electronic component-placement region.

As seen from the illustrations of FIGS. 4A to 4G, the supporting bank part 20 serves to support the electronic component, and thus it can also be referred to as "supporter for electronic component". The supporting bank part 20 has a raised form surrounding the electronic component-placement region 40 to serve a positioning for the electronic component in the placement step thereof. As long as the supporting bank part has such raised form, it is not particularly limited. For example, the supporting bank part 20 may be made of a resin material and/or a metal material. Examples of the resin material for the supporting bank part 20 may include an epoxy resin, a silicone resin, a polyimide resin, a phenol resin and an acrylic resin. The supporting bank part 20 made of the resin material can be provided by a printing process so that the printed resin material has a patterned form. Alternatively, in a case of a photosensitive resin layer, the photolithography process including the exposure to the light and the subsequent development can be available for the provision of the supporting bank part 20. Examples of the metal material of the supporting bank part 20 may include Cu (copper), Al (aluminum), and an alloy thereof. The supporting bank part 20 made of the metal material can be provided by a metal plating process so that the plated metal material has a patterned form. Alternatively, the supporting bank part 20 may be provided by an application of the metal plating material on the whole of the principal surface "A" of the metal foil 10, followed by an etching thereof in the photolithography so that the applied material has a patterned form. In view of the re-workability of the electronic component in a later step of the placement thereof, it is preferred that the supporting bank part 20 has no adhesive property with respect to the electronic component. The height of the supporting bank part 20, which serves to substantially position the electronic component with no misalignment in the placement step thereof, is enough. As such, it is preferred that the supporting bank part 20 has its shorter height than that of the electronic component, based on the bottom surface of the electronic component-placement region 40. For example, the height of the supporting bank part 20 may be in the approximate range of 50 μm to 500 μm. In the manufacturing method of the present invention according to the first embodiment, the supporting bank part 20 may be provided at a point in time before the formation of the through-hole 30, or at a point in time after the formation of the through-hole 30.

According to the first embodiment, as shown in FIG. 4C, the electronic component 50 is placed on the electronic component-placement region 40 surrounded by the supporting bank part 20. That is, the placement of the electronic component 50 is performed such that the electronic component 50 is fitted into the supporting bank part 20 on the metal foil. This means that the electronic component 50 is placed such that it is positioned in the space surrounded by the supporting bank part 20. This makes it possible to more precisely position the electronic component 50 in the electronic component-placement region, and thereby the through-hole 30 of the metal foil 10 is suitably capped with the electrode 55 of the electronic component.

The steps subsequent to the placement of the electronic component 50 are the same as those described above. That is, through the formation of the sealing resin layer 60, the formation of the metal wiring layer 70 (70', 70"), there can be obtained the desired electronic component package 100 (see FIG. 5). As seen from the illustration of FIG. 4C, the supporting bank part 20 has a function of securing the placed electronic component 50 to the metal foil. As such, the first embodiment makes it possible to more suitably perform the subsequent process steps at a point in time after the placement of the electronic component.

(Second Embodiment)

The process of the manufacturing method according to the second embodiment of the present invention is shown in FIGS. 6A-6F.

The second embodiment has such a feature that the metal foil provided with another positioning means, which is different from that of the first embodiment, is used in the step (i). Specifically, as shown in FIGS. 6A and 6B, a recessed portion 25 is used as the positioning means of the metal foil, the recessed portion 25 being provided in the electronic component-placement region by a counterbore machining of the metal foil.

The second embodiment enables the electronic component 50 to be more precisely position the metal foil in the electronic component-placement region 40 with no need of the additional provision of the part, e.g., the supporting bank part 20 on the metal foil. That is, the use of the recessed portion 25 makes it possible to place the electronic component such that the through-hole 30 of the metal foil 10 is surely capped with the electrode 55 of the electronic component.

Figure 6A:
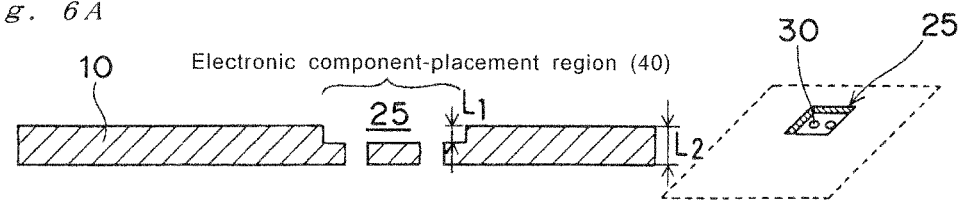
FIGS. 6A to 6F are process-cross sectional views schematically illustrating a manufacturing method of an electronic component package according to an embodiment (Second Embodiment) of the present invention.

Specifically, the metal foil 10 is subjected to the counterbore machining process to form the recessed portion 25, and thereby recessed portion 25 is used as the electronic component-placement region 40 (see FIG. 6A). The electronic component 50 is then placed on the electronic component-placement region 40 provided by the recessed portion 25, as shown in FIG. 6B. As shown here, the placement of the electronic component 50 is performed such that the electronic component 50 is at least fitted into the recessed portion 25 of the metal foil. This means that the electronic component 50 is placed such that it is housed in the space provided by the recessed portion 25. This makes it possible to more precisely position the electronic component 50 in the electronic component-placement region, and thereby the through-hole 30 of the metal foil 10 is suitably capped with the electrode 55 of the electronic component.

Figure 6B:
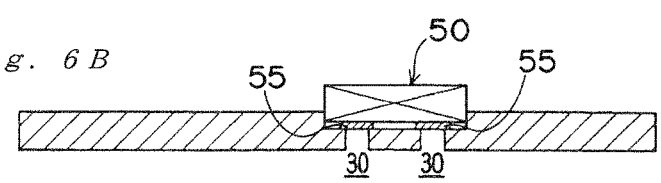
Figure 6C:
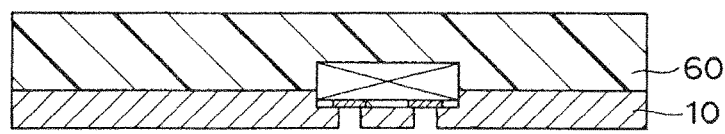
Figure 6D:
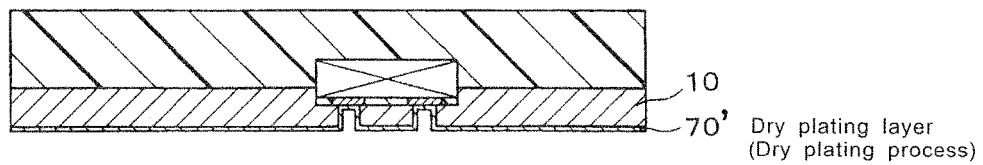
Figure 6E:
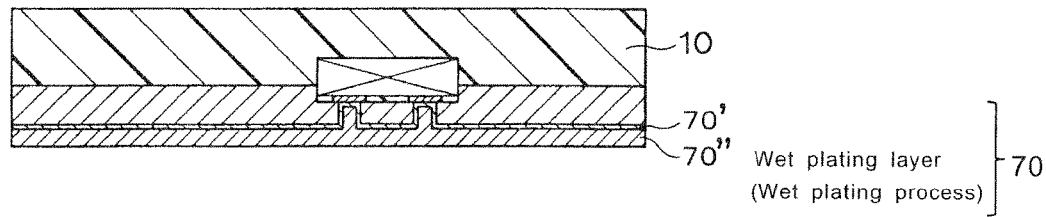
Figure 6F:
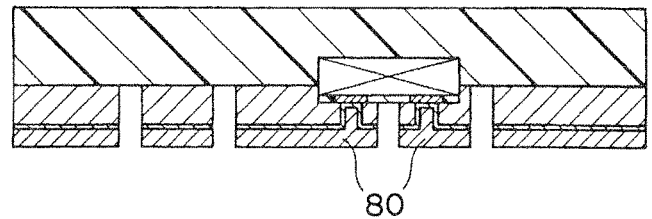

As seen from the illustration of FIG. 6B, the recessed portion 25 has a function of securing the placed electronic component 50 to the metal foil. As such, the second embodiment makes it possible to more suitably perform the subsequent process steps at a point in time after the placement of the electronic component.

The depth dimension "$L_1$" of the recessed portion 25 is not particularly limited to, but may be preferably in the approximate range of 5% to 50%, more preferably in the approximate range of 10% to 30%, based on the thickness "$L_2$" of the metal foil 10 (see FIG. 6A). Such dimension enables the placed electronic component 50 to be more suitably secured to the metal foil by the recessed portion 25.

The steps subsequent to the placement of the electronic component 50 are the same as those described above. That is, through the formation of the sealing resin layer 60, the formation of the metal wiring layer 70 (70', 70"), there can be obtained the desired electronic component package 100.

(Third Embodiment)

Figure 7:
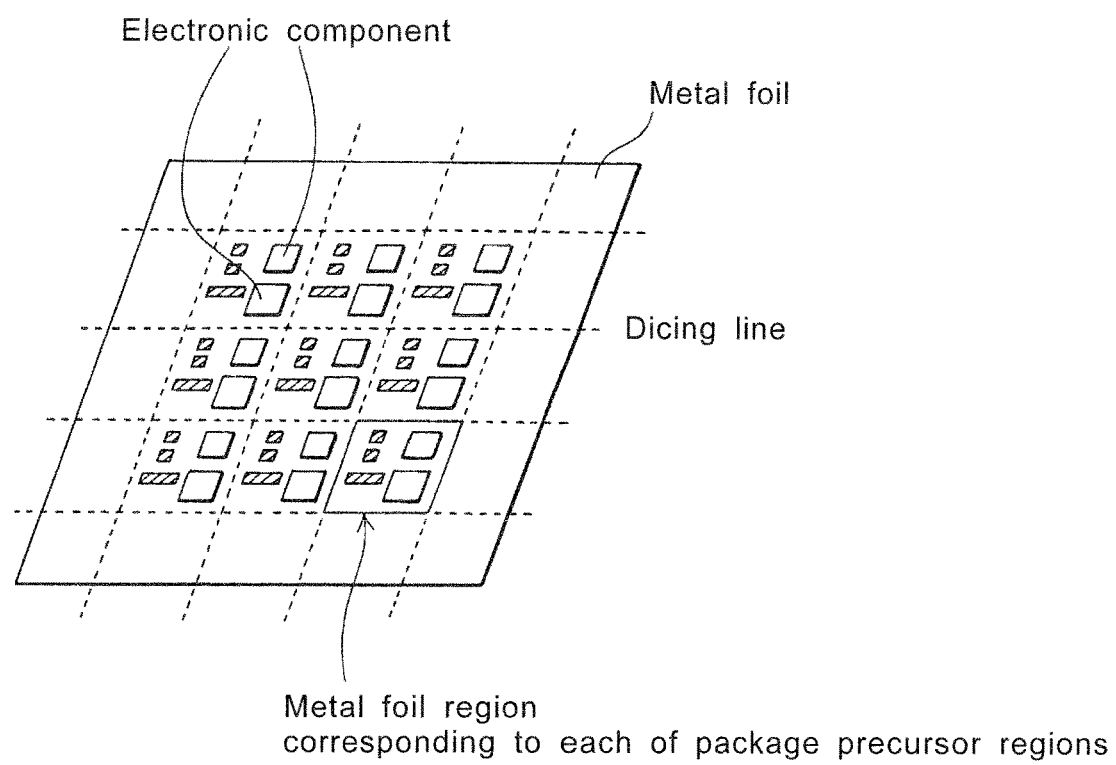
FIG. 7 is a process-cross sectional view schematically illustrating a manufacturing method of an electronic component package according to an embodiment (Third Embodiment) of the present invention.

The third embodiment is suitable for a concurrent manufacturing of a plurality of electronic component packages. According to this embodiment of the method of the present invention, a plurality of the electronic component packages can be manufactured concurrently. Specifically, a metal foil with a plurality of package precursor regions included therein is used in the step (i). For example, the metal foil having "supporting bank part 20 provided on the metal foil such that the supporting bank part surrounds the electronic component-placement region" or "recessed portion 25 provided in the electronic component-placement region by a counterbore machining of the metal foil". In the step (ii), the electronic components to be used for respective ones of the electronic component packages are placed in the respective ones of the package precursor regions of the metal foil (see FIG. 7). This makes it possible to produce a precursor of the electronic component packages (in which a plurality of package precursors are integrated with each other) at a time. The precursor of the electronic component packages is then subjected to a dicing process (see FIG. 7) to provide the plurality of electronic component packages. Namely, at a point in time after the step (iv), a dicing operation may be performed to divide the package precursor regions of the metal foil into respectively-separated regions, which results in a production of the plurality of electronic component packages.

(Fourth Embodiment)

Figure 8A:
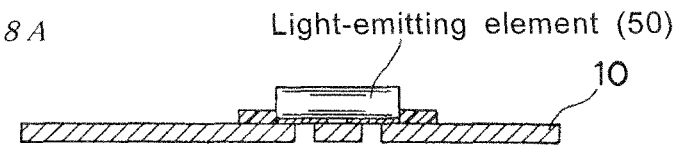
FIGS. 8A to 8H are process-cross sectional views schematically illustrating a manufacturing method of an electronic component package according to an embodiment (Fourth Embodiment) of the present invention.
Figure 8B:
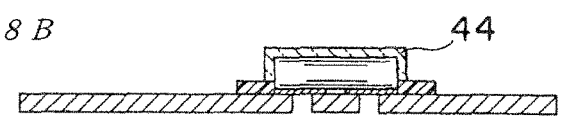
Figure 8C:
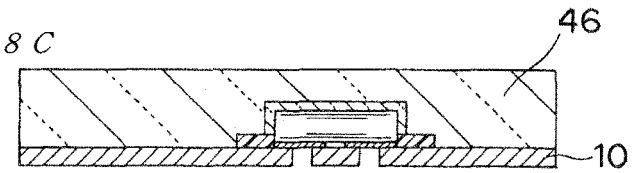
Figure 8D:
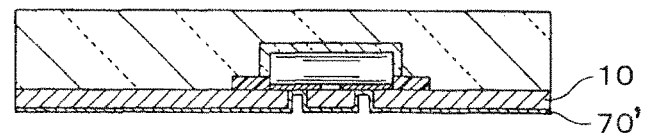
Figure 8E:
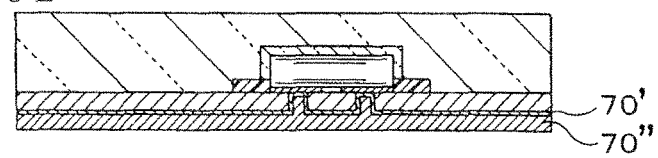
Figure 8F:
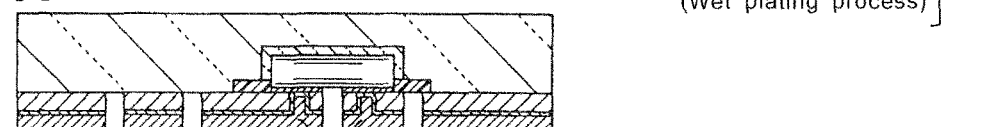
Figure 8G:
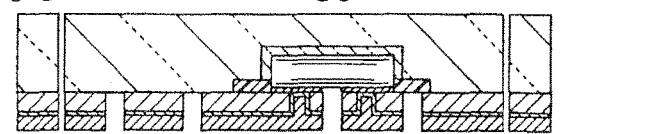
Figure 8H:
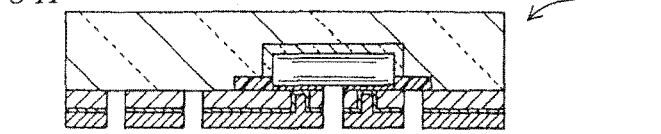

The fourth embodiment is suitable for the manufacturing of a light-emitting package. This embodiment of the method of the present invention also makes it possible to suitably manufacture the light-emitting element package when a light-emitting element is provided as the electronic component (i.e., when the light-emitting element is included as the electronic component to be placed in electronic component-placement region in the step (ii)). In the manufacturing of the light-emitting element package, the formations of a fluorescent layer and a transparent resin layer are performed instead of the formation of the sealing resin layer. Specifically, the fluorescent layer 44 is formed on the light-emitting element 50 disposed on the metal foil 10, and thereafter the transparent resin layer 46 is formed to cover the light-emitting element and the fluorescent layer (see FIGS. 8A to 8C). The formations of the fluorescent layer and the transparent resin layer may be similar to those generally used in a conventional LED package manufacturing. The subsequent steps after the formations of the fluorescent layer and the transparent resin layer are the same as those described above (see FIGS. 8D to 8H). As a result, there can be obtained the desired electronic component package 100 with a desired form of light-emitting element package.

[Electronic Component Package of the Present Invention]

An electronic component package according to an embodiment of the present invention will now be described. The electronic component package of the present invention is a package obtained by the above mentioned manufacturing method according to an embodiment of the present invention.

Figure 9:
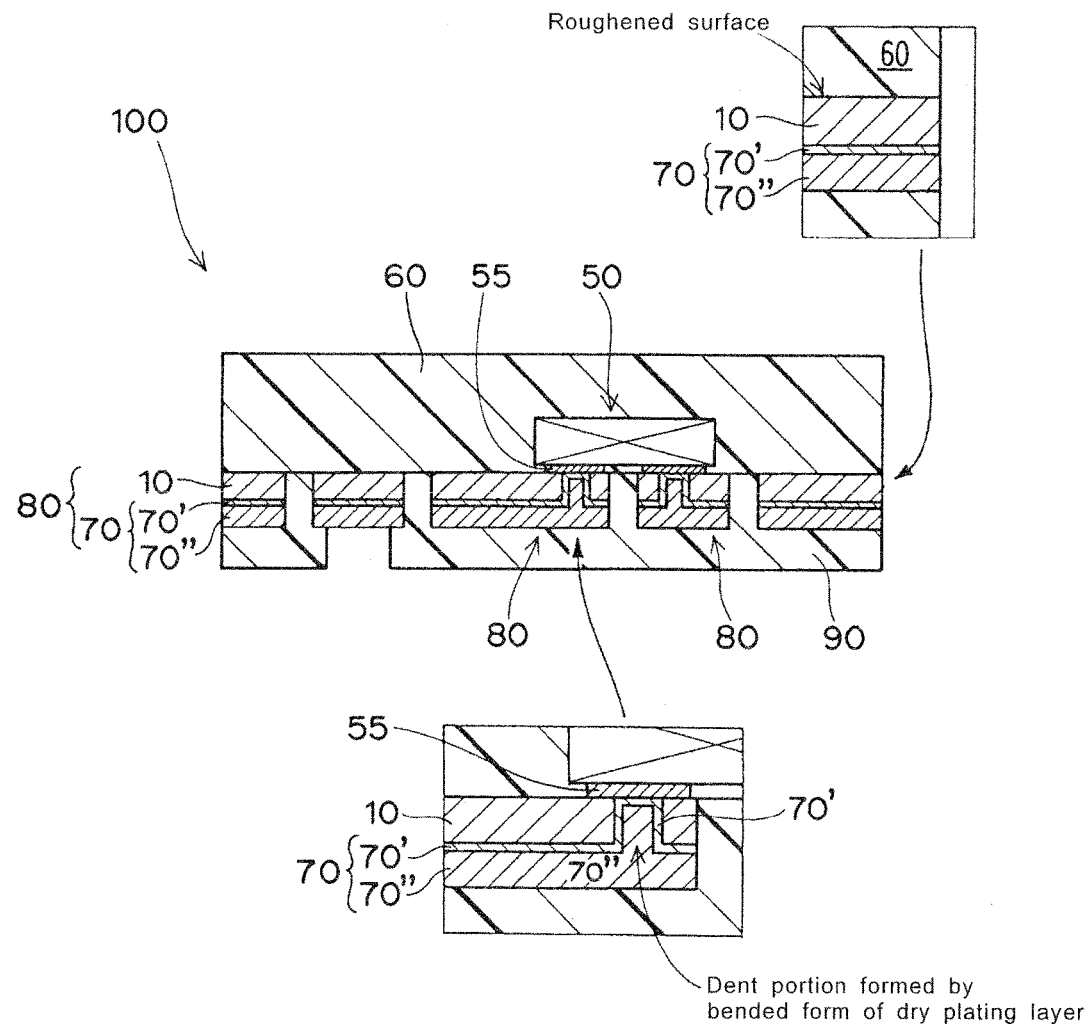
FIG. 9 includes cross-sectional views schematically illustrating a configuration of an electronic component package according to an embodiment of the present invention.

FIG. 9 illustrates a configuration of the electronic component package 100 according to an embodiment of the present invention. As shown in FIG. 9, the electronic component package 100 comprises the sealing resin layer 60, the electronic component 50, and the metal wiring layer 80 in contact with the electrode 55 of the electronic component 50.

As shown in FIG. 9, the electronic component 50 is in an embedded state in the sealing resin layer 60. In the package according to an embodiment of the present invention, the sealing resin layer 60 has the electronic component 50 therein, and the electronic component 50 is in the embedded state in the resin layer 60 such that the electronic component 50 is flush with the sealing resin layer 60. Namely, the surface of the electronic component 50 and the surface of the sealing resin layer 60 are on substantially the same plane. More specifically, it is preferred that the electrode 55 of the electronic component is flush with the sealing resin layer 60. This means that the surface of the electrode 55 of the electronic component and the surface of the sealing resin layer 60 are preferably on substantially the same plane.

As shown in FIG. 9, the metal wiring layer 80 is composed of the metal plating layer 70 and the metal foil 10, the metal plating layer being in contact with the electrode of the electronic component, the metal foil being in contact with the metal plating layer. Furthermore, the meal wiring layer 70 has a two-layered structure of the dry plating layer 70' located relatively inside and the wet plating layer 70" located relatively outside. Specifically, the dry plating layer 70' is provided such that it is in direct contact with the metal foil 10 and the electrode 55 of the electronic component, and the wet plating layer 70" is provided on the dry plating layer 70'. As such, the phrase " . . . located relatively outside" as used herein substantially means that the layer is located distally with respect to the exposed surface of the electrode of the electronic component, and whereas the phrase " . . . located relatively inside" as used herein substantially means that the layer is located proximally with respect to the exposed surface of the electrode of the electronic component.

The metal foil 10 included in the metal wiring layer 80 (i.e., metal foil 10 in a bonding with the sealing resin layer from another viewpoint) comprises at least one kind of metal material selected from the group consisting of Cu (copper), Al (aluminum), Ag (silver), Pd (palladium), Pt (platinum), Ni (nickel), Ti (titanium), Fe (iron), Zn (zinc), Zr (zirconium), Nb (niobium), Mo (molybdenum), Sn (tin), Ta (tantalum) and Au (gold). In particular, the metal foil 10 is preferably made of Cu (copper) or Al (aluminum). The thickness of the metal foil 10 is preferably in the range of 9 μm to 2000 μm, more preferably in the range of 18 μm to 1000 μm (for example, about 300 μm). In a case where the metal foil 10 has the roughened surface, it is preferred that the metal foil 10 is covered with the sealing resin layer 60 such that the roughened surface is in contact with the sealing resin layer 60 (see FIG. 9). As described above, the term "roughened surface" substantially means that an arithmetic mean roughness Rz of the surface of the metal foil is 5.0 μm or higher, preferably 7.0 μm or higher.

In the package according to an embodiment of the present invention, one or more kinds of the electronic component 50 is in an embedded in the sealing resin layer 60. Examples of the electronic component may include an IC (e.g., control IC), an inductor, a semiconductor element (e.g., MOS: metal-oxide semiconductor), a capacitor, a power element, a light-emitting element (e.g., LED), a chip resistor, a chip capacitor, a chip varistor, a chip thermistor and a chip laminate filter, a connection terminal and the like. According to a preferred embodiment of the present invention, the electrode 55 of the electronic component is in an exposed state at the surface of the sealing resin layer 60, and the metal plating layer 70 is in contact with the exposed electrode 55 of the electronic component.

The sealing resin layer 60, in which the electronic component is embedded, comprises an epoxy-based resin or a silicone-based resin, for example. The thickness of the sealing resin layer 60 is preferably in the approximate range of 0.5 mm to 5.0 mm, and more preferably in the approximate range of 1.2 mm to 1.8 mm.

In the package according to an embodiment of the present invention, it is preferred that the metal foil 10 with its relatively large thickness is used. In other words, it is preferred that the thickness of the metal plating layer 70 is smaller than the thickness of the metal foil 10. With the thick metal foil 10, a large thickness of the metal wiring layer 80 is suitably achieved. In the package according to an embodiment of the present invention, the metal foil and the electrode of the electronic component are in an electrical connection with each other via the metal plating layer. This leads to an provision of an desired wiring form. With this wiring form, the heat from the electronic component, if any, can be suitably released through the metal plating layer and the metal foil.

The dry plating layer 70', of which the metal plating layer 70 is composed, has a very thin form, and preferably has the thickness of nano-order, whereas the wet plating layer 70" has a thick form, and preferably has the thickness of micron-order. This means that most of the metal plating layer 70 consists of the wet plating layer 70". By way of example, the thickness of the dry plating layer 70' is preferably in the range of 100 nm to 1000 nm (for example, thickness 300 nm of Ti plus thickness 600 nm of Cu), the thickness of the wet plating layer 70" is preferably in the approximate range of 1 μm to 10 μm.

In the electronic component package according to an embodiment of the present invention, the dry plating layer 70' has such a bended form that the dry plating layer 70' is in direct contact with the electrode 55 of the electronic component (see the lower illustration in FIG. 9). While on the other hand, the wet plating layer 70" has such a form of thickness on the metal foil that a dent portion formed by the bended form of the dry plating layer 70' is filled with the wet plating layer (see the lower illustration in FIG. 9).

The dry plating layer 70', which is formed by the dry plating process, thus preferably comprises at least one kind of metal material selected from the group consisting of Ti (titanium), Cr (chromium), Ni (nickel) and Cu (copper). Alternatively, the dry plating layer 70' may comprise other metal material, for example at least one kind of metal material selected from the group consisting of Ag (silver), Al (aluminum), Al alloy, Au (gold), Pt (platinum), Sn (tin), W (tungsten) and the like. The dry plating layer can serve as a stress-releasing part, and thereby there can be improved the connection reliability in the electronic component package according to an embodiment of the present invention. While on the other hand, the wet plating layer 70", which is formed by the wet plating process, thus preferably comprises at least one kind of metal material selected from the group consisting of Cu (copper) and Al (aluminum). Alternatively, the wet plating layer 70" may comprise other metal material, for example at least one kind of metal material selected from the group consisting of Ag (silver), Pd (palladium), platinum (Pt) and nickel (Ni). However, when focusing on "heat releasing" in particular, it is preferred that the material of the wet plating layer 70" has high thermal conductivity which effectively contributes to the heat releasing of the package. In this regard, the material of the wet plating layer 70" preferably comprises the copper (Cu). Furthermore, in view of the package with a satisfactory connection reliability, it is preferred that the metal foil 10, the dry plating layer 70' and the wet plating layer 70" respectively comprise the same kind of metal material as each other. It should also be noted that the form of the dry plating layer 70' is not limited to a single layer form, but may be a stacked-layers form. For example, the dry plating layer 70' may have a two-layered structure composed of a Ti dry plating layer and a Cu dry plating layer located thereon.

As seen from FIG. 9, the metal wiring layer 80 and the electrode 55 of the electronic component have mutual surface contact (or direct bonding) with each other via the metal plating layer 70 in the electronic component package 100 according to an embodiment of the present invention. As such, the metal wiring layer 80 and the electronic component 50 are in an electrical connection with each other. The term "surface contact" (or direct bonding) used herein means an embodiment wherein principal surfaces (upper and lower surfaces) of respective ones of the objects are contacted or bonded with each other, in particular an embodiment wherein overlapping regions between the principal surfaces (upper and lower surfaces) of respective ones of the objects are all contacted with each other. More specifically, the term "surface contact" (or direct bonding) means an embodiment wherein the overlapping regions between "principal surface of the electrode of the electronic component (i.e., lower principal surface thereof exposed via the through-hole of the metal foil)" and "principal surface (i.e., upper principal surface) of a part of the metal plating layer, the part being located in the interior of the through-hole of the metal foil" are all contacted with each other. In other words, the term "surface contact (or direct bonding)" used herein means an embodiment wherein the mutual overlapping regions of a part of the metal plating layer (a part of the dry plating layer in particular) and a part of the electrode of the electronic component, both of which are located inside the through-hole of the metal foil, are all contacted, as seen from an embodiment shown in FIG. 10 where the lower principal surface area "A" and the upper principal surface area "B" are all contacted with each other.

Due to "surface contact" (or direct bonding), the electronic component package 100 according to an embodiment of the present invention is capable of effectively releasing the heat from the electronic component 50 to the outside via the metal plating layer 70 in surface contact (or direct bonding) with the electrode 55 of the electronic component 50 and also the thick metal foil 10 connected and integrated therewith. That is, the metal plating layer 70 and the thick metal foil 10 serve as a heat sink which effectively contributes to the high heat-releasing performance of the package.

With the surface contact (or direct bonding) between the electrode 55 of the electronic component and the metal wiring layer 80, an extremely improved heat-releasing can be achieved since no heat-release inhibitor is provided, compared to the mounting case with the wire bonding or bump used. Due to the high heat-releasing of the package according to an embodiment of the present invention, a performance, an operating lifetime and the like of the electronic component can be increased, and also degeneration and discoloration of the sealing resin, which are attributed to the heat, can be effectively prevented. Furthermore, due to the "surface contact" (or direct bonding), the electric resistance of the package is more desirable than that of the case of the electrical connection via bump or wire. As such, the package according to an embodiment of the present invention enables a larger electric current to be applied therein. For example, in a case of the light-emitting package (e.g., LED package), the higher luminance can be achieved due to the high heat-releasing and the large electric current.

As shown in the drawings, the contact interface between the dry plating layer and the electrode has a smaller size (i.e., smaller area) than that of the surface of the electrode in the electronic component package 100 according to an embodiment of the present invention. For example, the contact interface between the dry plating layer 70' and the electrode 55 is preferably in the approximate range of 40% to 95%, more preferably in the approximate range of 60% to 90%.

The package according to an embodiment of the present invention may be provided with a resist layer in order to achieve a more preferred form as a package product. In this regard, the electronic component package may comprise the resist layer provided with respect to the metal wiring layer. More specifically, it is preferred as shown in FIG. 9 that the solder resist layer 90 is provided such that the metal wiring layer is partially covered with the resist layer 90. The resist layer 90 in itself may be the same as that generally provided in the electronics packaging field.

Figure 11:
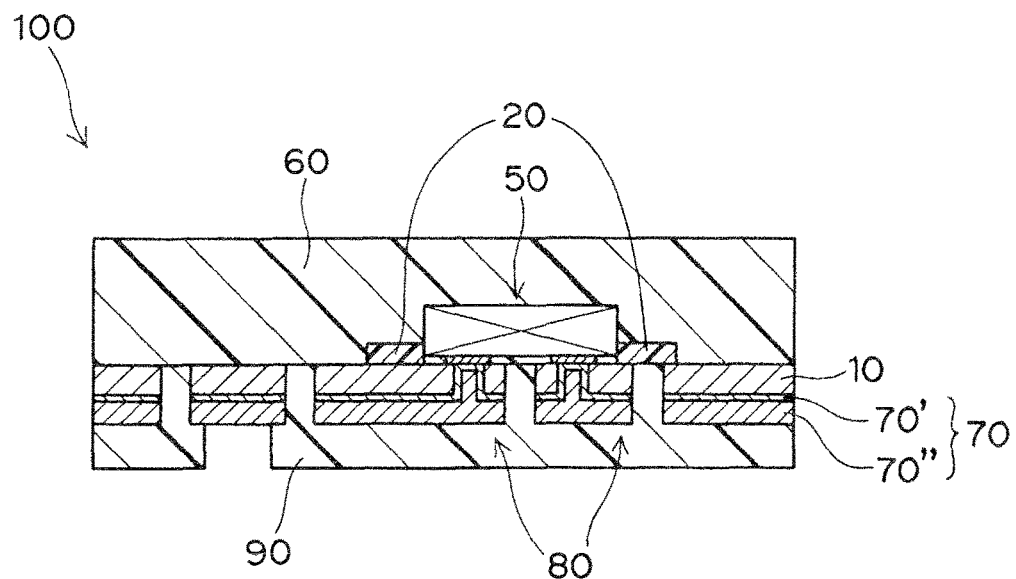
FIG. 11 is a cross-sectional view schematically illustrating a configuration of an electronic component package according to First Embodiment of the present invention.

In a case where "supporting bank part 20" is used in the manufacturing method of the package, the supporting bank part 20 is in an embedded state in the sealing resin 60, as shown in FIG. 11. Preferably, the supporting bank part 20 is in the embedded state in the sealing resin layer 60 such that the supporting bank part 20 is flush with the sealing resin layer 60. Namely, the surface of the supporting bank part 20 and the surface of the sealing resin layer 60 are preferably on substantially the same plane. Similarly, the electronic component 50 is also in a form of "flush". In the electronic component package 100 according to a preferred embodiment of the present invention, not only the surface of the supporting bank part 20 and the surface of the sealing resin layer 60 are preferably on substantially the same plane, but also the surface of the electronic component 50 and the surface of the sealing resin layer 60 are preferably on substantially the same plane. By way of example, the height dimension of the supporting bank part 20 may be in the range of 50 μm to 500 μm.

In the electronic component package 100 shown in FIG. 11, the buried electronic component 50 in the sealing resin layer 60 is located closer to the upper surface of the sealing resin layer 60. Consequently, the heat from the electronic component 50 can be readily released via the upper surface of the sealing resin layer. Due to not only the larger thickness of the metal wiring layer 80, but also the level of the location of the electronic component 50 in the sealing resin layer 60, a desired high-releasing performance can be suitably achieved. In a case where the supporting bank part 20 is made of the highly heat-conductive material (e.g., metal material), the supporting bank part 20 can serve as a heat sink, which is similar to the metal wiring layer 80. In another case where the supporting bank part 20 is made of the resin material, the supporting bank part 20 can serve as a stress-releasing part, and thereby there can be provided such an advantageous effect that the possible stress of the electronic component package can be reduced.

In a case where the recessed portion 25 is used as the positioning means, a part of an interfacial boundary between the resin sealing layer 60 and the metal wiring layer 80 is provided with a recessed face. The electronic component 50 is provided such that it is located within the recessed portion 25. In the electronic component package with the recessed portion 25, the electronic component is located adjacent to the metal wiring layer 80. Preferably, a part of the electronic component in addition to the electrode thereof is in direct contact with the metal wiring layer 80. This makes it possible to release the heat from the electronic component to be further released via the metal wiring layer 80.

Figure 12:
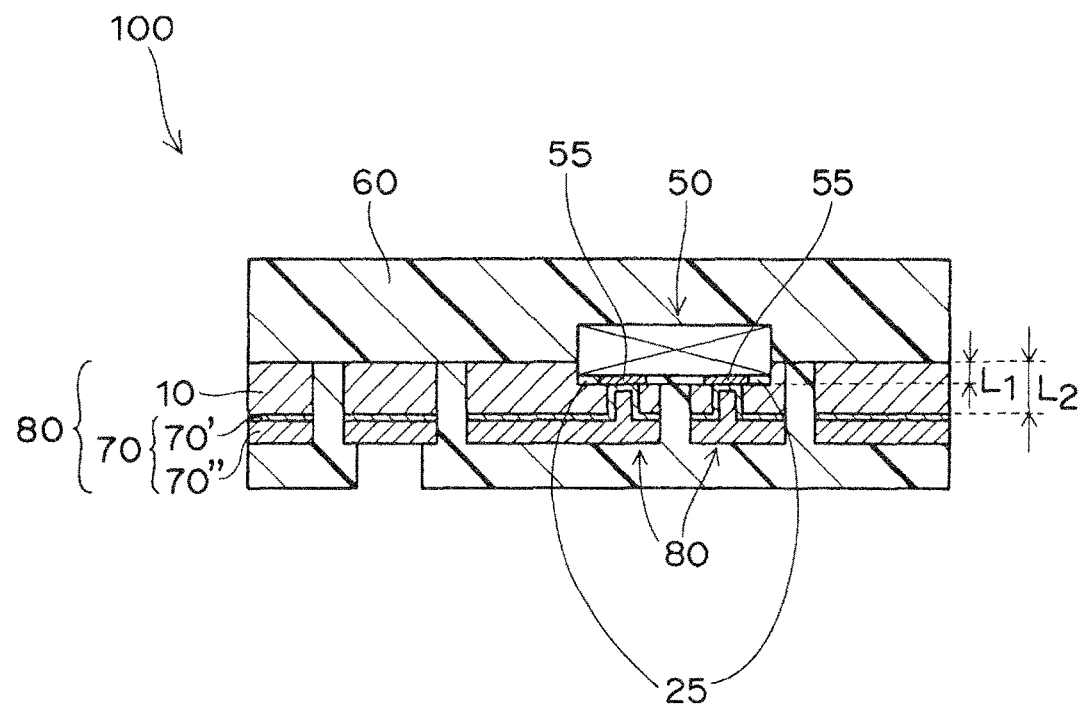
FIG. 12 is a cross-sectional view schematically illustrating a configuration of an electronic component package according to Second Embodiment of the present invention.

The depth dimension "$L_1$" of the recessed portion 25 is not particularly limited to, but may be preferably in the approximate range of 5% to 50%, more preferably in the approximate range of 10% to 30%, based on the thickness "$L_2$" of the metal foil 10 of the metal wiring layer 80 (see FIG. 12). Such depth dimension enables the placed electronic component 50 to be more suitably secured and hold in place by the recessed portion 25.

Figure 13:
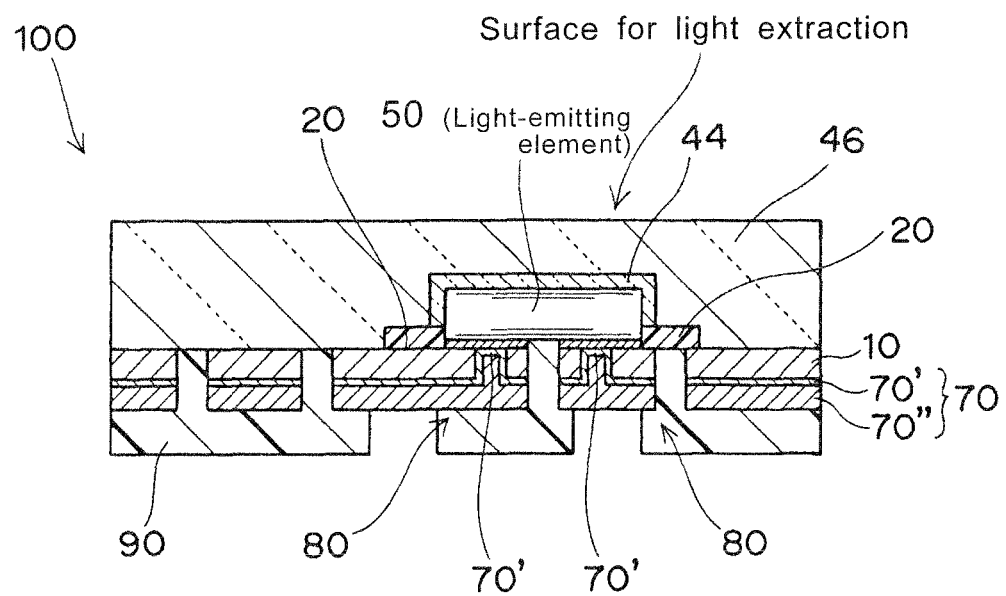
FIG. 13 is a cross-sectional view schematically illustrating a configuration of an electronic component package (light-emitting element package) according to Fourth Embodiment of the present invention.

The electronic component package according to an embodiment of the present invention can be provided as a light-emitting package. Namely, in a case where a light-emitting element is included as the electronic component, the electronic component package may have such a structure of the light-emitting package, as shown in FIG. 13. In such light-emitting package 100, a fluorescent layer and a transparent resin layer are preferably provided. Instead of the sealing resin layer in which the electronic component and the supporter for electronic component are embedded, it is preferred as shown in FIG. 13 that the fluorescent layer 44 is provided on the light-emitting element, and also the transparent resin layer 46 is provided such that the light-emitting element 50 and the fluorescent layer 44 are covered with the transparent resin layer. This makes it possible to achieve a more preferred form of the electronic component package 100 as the light-emitting element package. The material and thickness for the fluorescent layer and the transparent resin layer may be the same as those conventionally used in the general LED packages. The term "light-emitting element" used herein substantially means an element capable of emitting the light. Examples of the light-emitting element include a light-emitting diode (LED) and an electronic component equipped therewith. As such, the term "light-emitting element" as used herein means not only a "bare chip type LED (i.e., LED chip)" but also a "discrete type light-emitting element wherein a molding of the LED chip is provided". The LED chip may also be a semiconductor laser chip.

In a case of the light-emitting package as shown in FIG. 13, the dry plating layer 70' and/or the supporting bank part 20 can be suitably used as a reflective layer. In this case, the reflective layer is located beneath the light-emitting element such that they are adjacent to each other. The downward light emitted from the light-emitting element can be reflected by this reflective layer (i.e., the supporter for the electronic component). As a result, the downward light emitted from the light-emitting element can be eventually reoriented upwardly by the reflective layer. When the high reflectivity is an important consideration, the dry plating layer 70' and/or the supporting bank part 20 preferably comprises a metal material selected from the group of Ag (silver) and Al (aluminum).

The electronic component package with the supporting bank part 20 included therein is also excellent in the light extraction, especially in the light extraction from the upper surface of the sealing resin layer. Specifically, due to the presence of the supporting bank part 20, the light-emitting element 50 is in an embedded state in the sealing resin layer (especially, in the transparent resin layer 46) such that the light-emitting element 50 is located closer to the upper surface (i.e., light extraction surface) of the sealing resin layer. See FIG. 13.

It should be noted that the present invention as described above includes the following aspects:

The first aspect: A method for manufacturing an electronic component package, the method comprising the steps of:

(i) preparing a metal foil having opposed principal surfaces "A" and "B" and a through-hole, the principal surface "A" being for placement of an electronic component, the through-hole being located in an electronic component-placement region of the principal surface "A";

(ii) placing the electronic component on the metal foil such that the electronic component is positioned in the electronic component-placement region, and an opening of the through-hole is capped with an electrode of the electronic component;

(iii) forming a sealing resin layer on the principal surface "A" of the metal foil such that the electronic component is covered with the sealing resin layer; and (iv) forming a metal plating layer on the principal surface "B" of the metal foil, wherein a dry plating process and a subsequent wet plating process are performed in the step (iv) to form the metal plating layer such that the through-hole of the metal foil is filled with the metal plating layer, and the metal foil and the metal plating layer are integrated with each other.

The second aspect: The method according to the first aspect, wherein the metal foil provided with a positioning means for the electronic component is prepared in the step (i), and the electronic component is positioned in the electronic component-placement region by the positioning means in the step (ii), and wherein a supporting bank part or a recessed portion is used as the positioning means, the supporting bank part being provided on the metal foil such that the supporting bank part surrounds the electronic component-placement region, the recessed portion being provided in the electronic component-placement region of the metal foil by a counterbore machining of the metal foil.

The third aspect: The method according to the first or second aspect, wherein the electrode of the electronic component has a larger electrode area than an opening area of the through-hole of the metal foil.

The fourth aspect: The method according to any one of the first to third aspects, wherein a dry plating layer in direct contact with the electrode of the electronic component via the through-hole is formed by the dry plating process, and a wet plating layer in direct contact with the dry plating layer is formed by the wet plating process.

The fifth aspect: The method according to the fourth aspect, wherein a layer having a bended form along an outline of the through-hole is formed as the dry plating layer.

The sixth aspect: The method according to the fourth or fifth aspect, wherein a layer having a form of thickness on the metal foil, completely filling the through-hole is formed as the wet plating layer.

The seventh aspect: The method according to any one of the first to sixth aspects, wherein a dry plating layer with its thickness of 100 nm to 1000 nm is formed by the dry plating process, whereas a wet plating layer with its thickness (thickness of layer area other than the through-hole area) of 1 µm to 10 µm is formed by the wet plating process.

The eighth aspect: The method according to any one of the first to seventh aspects, wherein a sputtering is performed as the dry plating process, whereas an electroplating is performed as the wet plating process.

The ninth aspect: The method according to any one of the first to eighth aspects, wherein the integrated metal foil and metal plating layer are subjected to a patterning process to form a metal wiring layer therefrom.

The tenth aspect: The method according to any one of the first to ninth aspects, wherein a light-emitting element is included as the electronic component to be placed in the step (ii), and instead of forming the sealing resin layer in the step (iii), a fluorescent layer is formed on the light-emitting element, and thereafter a transparent resin layer is formed to cover the light-emitting element and the fluorescent layer.

The eleventh aspect: An electronic component package, comprising:

a sealing resin layer;

an electronic component buried in the sealing resin layer; and a metal wiring layer provided on the sealing resin layer and in contact with an electrode of the electronic component, wherein the metal wiring layer is composed of a metal plating layer and a metal foil, the metal plating layer being in direct contact with the electrode of the electronic component, the metal foil being integrated with the metal plating layer, wherein the metal plating layer has a two-layered structure of a dry plating layer and a wet plating layer, the dry plating layer having such a bended form that the dry plating layer is in direct contact with the electrode of the electronic component, the wet plating layer having such a form of thickness on the metal foil that a dent portion formed by the bended form of the dry plating layer is filled with the wet plating layer, and wherein a contact interface between the dry plating layer and the electrode has a smaller size (i.e., area) than that of a surface of the electrode.

The twelfth aspect: The electronic component package according to the eleventh aspect, further comprising a supporting bank part on the metal foil such that the supporting bank part surrounds the electronic component, or a recessed portion in the metal foil such that the electronic component is at least partly located within the recessed portion.

The thirteenth aspect: The electronic component package according to the eleventh or twelfth aspect, wherein a thickness of the metal plating layer (thickness of layer area other than the dent portion of the dry plating layer) is smaller than that of the metal foil.

The fourteenth aspect: The electronic component package according to any one of the eleventh to thirteenth aspects, wherein the metal foil has a thickness of 18 µm to 1000 µm.

The fifteenth aspect: The electronic component package according to any one of the eleventh to fourteenth aspects, wherein the dry plating layer has a thickness of 100 nm to 1000 nm, whereas the wet plating layer has a thickness (thickness of layer area other than the dent portion of the dry plating layer) of 1 µm to 10 µm.

The sixteenth aspect: The electronic component package according to any one of the eleventh to fifteenth aspects, wherein, the metal foil comprises at least one kind of a metal material selected from a group consisting of Cu and Al, the dry plating layer comprises at least one kind of a metal material selected from a group consisting of Ti, Cr, Ni and Cu, and the wet plating layer comprises at least one kind of a metal material selected from a group consisting of Cu, Ni and Al.

The seventeenth aspect: The electronic component package according to the sixteenth aspect, wherein the metal foil, the dry plating layer and the wet plating layer comprise the same kind of metal material as each other.

The eighteenth aspect: The electronic component package according to any one of the eleventh to seventeenth aspects, further comprising a resist layer provided with respect to the metal wiring layer.

The nineteenth aspect: The electronic component package according to any one of the eleventh to eighteenth aspects, wherein at least a part of the metal wiring layer serves as a heat-releasing part of the electronic component package.

The twentieth aspect: The electronic component package according to any one of the eleventh to nineteenth aspects, wherein a light-emitting element is provided as the electronic component, and instead of the sealing resin layer, a fluorescent layer is provided on the light-emitting element, and also a transparent resin layer is provided such that the light-emitting element and the fluorescent layer are covered with the transparent resin layer.

While some embodiments of the present invention have been hereinbefore described, they are merely the typical embodiments. It will be readily appreciated by those skilled in the art that the present invention is not limited to the above embodiments, and that various modifications are possible without departing from the scope of the present invention.

EXAMPLES

The electronic component package was manufactured according to an embodiment of the present invention.
(Material for Package)
The main parts used for the manufacturing of the package were as follows.

| Adhesive carrier (Adhesive film) | Liquid epoxy resin |
|---|---|
| Supporting bank part | Photosensitive epoxy-based permanent resist |
| Copper foil | Copper foil (about 300 μm) with gloss surface on one face and roughened surface on the other face, i.e., resin side face |

The electronic component package was obtained by the following processes.

As a result of the above processes, there was able to be obtained the package with "substrate-less", "wire bonding-less/bump-less", "solder material-less".

It was confirmed that the bump-less thick metal plating layer, together with the integrated metal foil therewith, had been formed with respect to "exposed surface of electrode of electronic component", and that the metal plating layer and the thick metal foil were capable of serving suitably as a heat sink.

INDUSTRIAL APPLICABILITY

The present invention can be suitably used in various applications of electronics packaging field. For example, the present invention can be suitably available in an electric source package (e.g., POL converter such as voltage step down DC-DC converter), a LED package, a module with a built-in component.

EXPLANATION OF REFERENCE NUMERALS

10 Metal foil
20 Supporting bank part
25 Recessed portion
30 Through-hole
40 Electronic component-placement region
44 Fluorescent layer
46 Transparent resin layer
50 Electronic component
55 Electrode of electronic component
60 Sealing resin layer
70 Metal plating layer
70' Dry plating layer
70" Wet plating layer
80 Metal wiring layer
90 Resist layer

| | |
|---|---|
| DFR lamination | Lamination of dry film resist on copper foil (single face lamination). |
| Lithographic exposure | Exposure of DFR to UV light via patterned mask, with shape of through-holes being locally exposed. |
| Development | Development of DFR with alkaline developer. |
| Etching | Etching of copper foil with ferric chloride solution to provide through-holes in copper foil. |
| Removal | Swelling removal of DFR with alkaline stripping liquid. |
| Lamination of permanent resist | Lamination of permanent resit on copper foil |
| Lithographic exposure | Exposure of permanent resist to UV light via patterned mask, with shape of electronic component-supporter being locally exposed. |
| Development | Development of permanent resist with alkaline developer. |
| Mounting | Mounting of electronic component. |
| Sealing resin preparation | Metering of predetermined amount of liquid epoxy rein, and then filling die therewith |
| Vacuum heat press | Charging die in heat press (heated at about 50° C.), and decompression into a pressure of about −0.1 MPa by vacuum pump, followed by holding it for about five minutes. Then, heating up to about 120° C. and pressurizing up to about 0.1 MPa, followed by holding it for about 15 minutes. |
| Demolding | Removal of die from heat press, followed by cooling thereof. Then, sample was taken out from die. |
| After-cure | Complete curing by dryer (about 150° C.) for about 60 minutes (in the air). |
| Sputtering (Ti/Cu) | Providing precursor in sputtering apparatus. Then, reverse sputtering plus Ti sputtering (about 200 Å), and Cu sputtering (about 800 Å) |
| Electrolytic Cu plating | Electrolytic Cu plating to provide thickness (up to about 10 um) of plating layer. |
| Liquid resist formation | Application of liquid resist ink by spin-coater. Drying until no tack is provided. |
| Lithographic exposure | Exposure of liquid resist layer to UV light via patterned mask, with shape of wiring being locally exposed. |
| Development | Development of liquid resist with alkaline developer. |
| Etching | Etching of Cu with ferric chloride solution. Then, removal of Ti layer with Ti etching liquid. |
| Removal | Removal of liquid resist with alkaline stripping liquid |
| Soder resist application | Screen printing of photosensitive solder resist print ink. Heat treatment until no adhesiveness is provided. |
| Lithographic exposure | Exposure of solder resist to UV light via patterned mask. |
| Development | Development of solder resist with alkaline developer. |
| Curing | Complete cure of solder resist by heat treatment. |
| Dicing | Cut into pieces with desired size by blade (with its width dimension of about 0.2 mm) of dicer device. |
| Stamping | Stamping of serial number on surface of sealing resin. |
| Inspection | Examining of electrical function. |
| Completion | Completion |

100' Precursor of electronic component package
100 Electronic component package

The invention claimed is:

1. A method for manufacturing an electronic component package, the method comprising:
   (i) preparing a metal foil having opposed principal surfaces "A" and "B" and a through-hole, the principal surface "A" for placement of an electronic component, and the through-hole being located in an electronic component-placement region of the principal surface "A";
   (ii) placing the electronic component on the metal foil such that the electronic component is positioned in the electronic component-placement region, and an opening of the through-hole is capped with an electrode of the electronic component;
   (iii) forming a sealing resin layer on the principal surface "A" of the metal foil such that the electronic component is covered with the sealing resin layer; and
   (iv) forming a metal plating layer on the principal surface "B" of the metal foil,
   wherein a dry plating process and a subsequent wet plating process are performed in the step (iv) to form the metal plating layer such that the through-hole of the metal foil is filled with the metal plating layer, and the metal foil and the metal plating layer are integrated with each other,
   wherein the metal foil prepared in the step (i) includes a positioning means for the electronic component, and the electronic component is positioned in the electronic component-placement region by the positioning means in the step (ii), and
   wherein a supporting bank part or a recessed portion is used as the positioning means, the supporting bank part surrounding the electronic component-placement region, and the recessed portion being provided in the electronic component-placement region by a counter-bore machining of the metal foil, the supporting bank part and the recessed portion for placing the electronic component.

2. The method according to claim 1, wherein the electrode of the electronic component has a larger electrode area than an opening area of the through-hole of the metal foil.

3. The method according to claim 1, wherein a dry plating layer in direct contact with the electrode of the electronic component via the through-hole is formed by the dry plating process, and a wet plating layer in direct contact with the dry plating layer is formed by the wet plating process.

4. The method according to claim 3, wherein a layer having a bended form along an outline of the through-hole is formed as the dry plating layer.

5. The method according to claim 3, wherein a layer having a form of thickness on the metal foil, completely filling the through-hole is formed as the wet plating layer.

6. The method according to claim 1, wherein a dry plating layer with a thickness of 100 nm to 1000 nm is formed by the dry plating process, whereas a wet plating layer with a thickness (a thickness of a layer area other than a through-hole area) of 1 μm to 10 μm is formed by the wet plating process.

7. The method according to claim 1, wherein a sputtering is performed as the dry plating process, whereas an electroplating is performed as the wet plating process.

8. The method according to claim 1, wherein the integrated metal foil and metal plating layer are subjected to a patterning process to form a metal wiring layer.

9. The method according to claim 1, wherein a light-emitting element is included as the electronic component placed on the metal foil in the step (ii), and
   as the forming of the sealing resin layer in the step (iii), a fluorescent layer is formed on the light-emitting element, and thereafter a transparent resin layer is formed to cover the light-emitting element and the fluorescent layer.

10. The method according to claim 1, wherein a height of the supporting bank part is shorter than a height of the electronic component, based on a bottom surface of the electronic component-placement region.

11. The method according to claim 10, wherein the height of the supporting bank part is in a range of 50 μm to 500 μm.

12. The method according to claim 1, wherein a depth dimension of the recessed portion is in a range of 5% to 50% of a thickness of the metal foil.

13. The method according to claim 1, wherein a depth dimension of the recessed portion is in a range of 10% to 30% of a thickness of the metal foil.

* * * * *